(12) United States Patent
Isobata

(10) Patent No.: US 12,404,135 B2
(45) Date of Patent: Sep. 2, 2025

(54) CARRIER TAPE PROCESSING DEVICE AND CARRIER TAPE PROCESSING METHOD

(71) Applicant: Panasonic Intellectual Property Management Co., Ltd., Osaka (JP)

(72) Inventor: Yoshinori Isobata, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 502 days.

(21) Appl. No.: 17/904,858

(22) PCT Filed: Jan. 21, 2021

(86) PCT No.: PCT/JP2021/001952
§ 371 (c)(1),
(2) Date: Aug. 23, 2022

(87) PCT Pub. No.: WO2021/192557
PCT Pub. Date: Sep. 30, 2021

(65) Prior Publication Data
US 2023/0111399 A1    Apr. 13, 2023

(30) Foreign Application Priority Data

Mar. 25, 2020  (JP) ................................ 2020-053534
Mar. 25, 2020  (JP) ................................ 2020-053536

(51) Int. Cl.
*B65H 19/22*     (2006.01)
*B65H 19/30*     (2006.01)
(Continued)

(52) U.S. Cl.
CPC .......... *B65H 19/2292* (2013.01); *B65H 19/30* (2013.01); *H05K 13/021* (2013.01);
(Continued)

(58) Field of Classification Search
CPC .. H05K 13/02; H05K 13/021; H05K 13/0084; H05K 13/086; H05K 13/0419;
(Continued)

(56) References Cited

U.S. PATENT DOCUMENTS 4,955,471 A  *  9/1990  Hirose ................... B65H 18/28
5,364,045 A  *  11/1994  Clayton ............. H05K 13/0417
                                                                221/70
(Continued)

FOREIGN PATENT DOCUMENTS

CN    101167417 A    4/2008
JP      5-021990      1/1993
WO    2020/202737    10/2020

OTHER PUBLICATIONS

English Translation of Chinese Search Report dated Oct. 31, 2024 for the related Chinese Patent Application No. 202180017833.7.
(Continued)

*Primary Examiner* — Anna M Momper
*Assistant Examiner* — Raveen J Dias
(74) *Attorney, Agent, or Firm* — MCDONALD HOPKINS LLC

(57) ABSTRACT

A roll body taking-out unit that takes out a roll body from a reel that holds a carrier tape storing components in a state of the roll body and stores the roll body in a case is provided. The roll body taking-out unit includes a separation unit that separates the roll body from the reel, and a roll body storage unit that stores the roll body separated from the reel by the separation unit in a case. Further, the roll body storage unit includes a case holding part that holds an empty case, and a chute part that stores the roll body separated from the reel by the separation unit one by one in the empty case held by the case holding part.

22 Claims, 17 Drawing Sheets

(51) Int. Cl.
*H05K 13/02* (2006.01)
*H05K 13/04* (2006.01)

(52) U.S. Cl.
CPC .............. *B65H 2301/41445* (2013.01); *B65H 2301/4185* (2013.01); *B65H 2301/418523* (2013.01); *B65H 2301/418526* (2013.01); *B65H 2301/41854* (2013.01); *B65H 2301/41858* (2013.01); *B65H 2301/419* (2013.01); *B65H 2701/11332* (2013.01); *B65H 2701/378* (2013.01); *B65H 2701/50* (2013.01); *B65H 2701/51* (2013.01); *H05K 13/0419* (2018.08)

(58) Field of Classification Search
CPC ........... H05K 13/0434; B65H 19/2292; B65H 19/30; B65H 2301/4186; B65H 2301/419; B65H 2301/41445; B65H 2301/41446; B65H 2301/4185; B65H 2301/418523; B65H 2301/41854; B65H 2301/41856; B65H 2301/41858; B65H 2701/11332; B65H 2701/37; B65H 27/378; B65H 2701/50; B65H 2701/51; B65D 85/00; B65D 85/66; B65D 85/67; B65D 85/671; B65D 85/672
USPC ............................................. 242/473.5, 474
See application file for complete search history.

(56) References Cited

U.S. PATENT DOCUMENTS

| | | | | |
|---|---|---|---|---|
| 5,454,900 A * | 10/1995 | Han | .................. | B65H 41/00 156/701 |
| 5,779,181 A * | 7/1998 | Nakae | .................. | B65H 19/26 242/532.6 |
| 6,206,198 B1 * | 3/2001 | Troxtell | ............. | H05K 13/0084 206/389 |
| 6,283,323 B1 * | 9/2001 | Endo | .................. | H05K 13/0419 242/608.6 |
| 9,517,909 B2 * | 12/2016 | Bauer | .................. | B65H 18/08 |
| 10,472,171 B2 * | 11/2019 | Chang | .................. | B65G 1/0421 |
| 11,535,472 B2 * | 12/2022 | Hernando Saiz | ...... | B65H 67/00 |
| 11,729,959 B2 * | 8/2023 | Kobayashi | ......... | H05K 13/0408 29/832 |
| 12,139,357 B2 * | 11/2024 | Yang | .................... | B65H 19/223 |
| 2002/0082337 A1 * | 6/2002 | Kawada | ............. | H05K 13/0084 524/528 |
| 2004/0039480 A1 * | 2/2004 | Kou | .................. | H05K 13/0215 700/222 |
| 2006/0207089 A1 * | 9/2006 | Maenishi | ............. | H05K 13/084 700/114 |
| 2008/0147232 A1 * | 6/2008 | Kuribayashi | ........ | H05K 13/087 29/832 |
| 2009/0229117 A1 * | 9/2009 | Saho | .................... | H05K 13/084 29/729 |
| 2016/0205819 A1 * | 7/2016 | Jacobsson | .......... | H05K 13/0417 700/112 |
| 2017/0034969 A1 * | 2/2017 | Eguchi | ............... | H05K 13/0419 |
| 2018/0118387 A1 * | 5/2018 | Eguchi | ............... | B65H 19/1852 |
| 2018/0130011 A1 * | 5/2018 | Jacobsson | ........... | H05K 13/021 |
| 2018/0179017 A1 * | 6/2018 | Kobayashi | ............. | B65H 49/24 |
| 2019/0084761 A1 * | 3/2019 | Chang | .................... | B65D 25/04 |
| 2019/0152067 A1 * | 5/2019 | Honsberg | ............ | B25J 15/0213 |
| 2021/0020474 A1 * | 1/2021 | Ng | ....................... | H05K 13/021 |
| 2021/0139264 A1 * | 5/2021 | Badini | ................. | B65H 19/123 |
| 2021/0227736 A1 * | 7/2021 | Kobayashi | ........... | H05K 13/086 |
| 2022/0162028 A1 * | 5/2022 | Isobata | ............... | B65H 49/328 |
| 2022/0289510 A1 * | 9/2022 | Yang | ..................... | B65H 18/021 |
| 2022/0356041 A1 * | 11/2022 | Hong | ..................... | B65H 23/02 |
| 2023/0089639 A1 * | 3/2023 | Suzuki | ............... | B65H 19/1842 242/556.1 |
| 2023/0112775 A1 * | 4/2023 | Isobata | ................ | B65G 1/137 700/214 |
| 2023/0114399 A1 * | 4/2023 | Ishitani | ................ | H05K 13/021 242/474.2 |
| 2023/0114831 A1 * | 4/2023 | Isobata | ............... | H05K 13/086 242/160.4 |
| 2023/0127175 A1 * | 4/2023 | Ishikawa | ................ | B65H 75/12 242/533 |
| 2023/0264311 A1 * | 8/2023 | Yan | ...................... | H05K 13/021 211/7 |
| 2023/0416035 A1 * | 12/2023 | Swann | .................. | B65H 18/026 |
| 2024/0017950 A1 * | 1/2024 | Xie | ..................... | B65H 19/2284 |
| 2024/0064948 A1 * | 2/2024 | Kato | .................... | B65H 16/005 |
| 2024/0324160 A1 * | 9/2024 | Kato | .................... | H05K 13/021 |

OTHER PUBLICATIONS

International Search Report of PCT application No. PCT/JP2021/001952 dated Apr. 13, 2021.

* cited by examiner

FIG. 12A
FIG. 12B
FIG. 12C
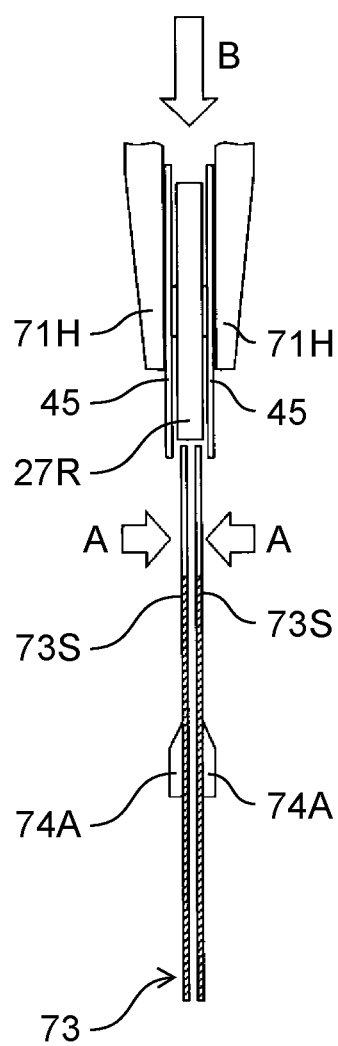
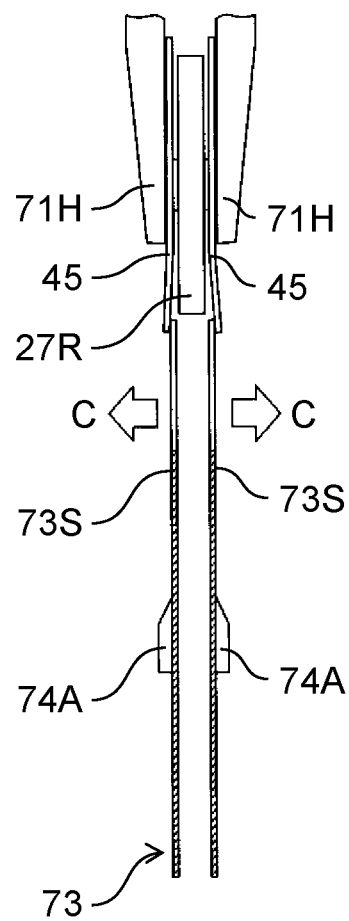
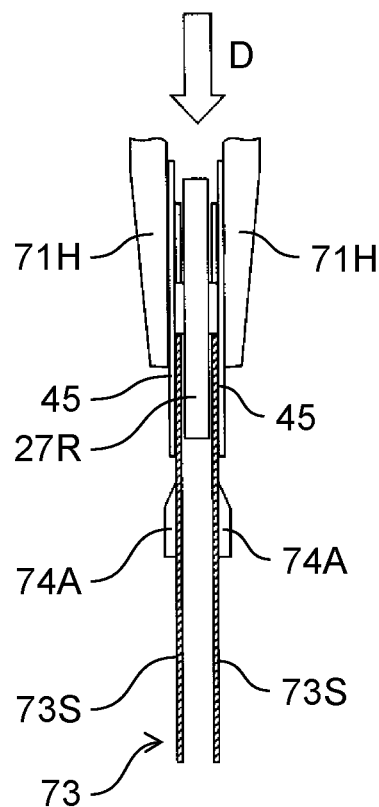

CARRIER TAPE PROCESSING DEVICE AND CARRIER TAPE PROCESSING METHOD

TECHNICAL FIELD

The present disclosure relates to a carrier tape processing device and a carrier tape processing method for processing a carrier tape storing components.

BACKGROUND ART

Conventionally, as a component supply unit in a component mounting device in which a component is mounted on a substrate, a tape feeder that supplies a component to a component extraction position by conveying a carrier tape storing the component is known. The carrier tape used in the tape feeder is wound around a reel as a holding body thereof, and transportation and storage of the carrier tape, setting of the carrier tape with respect to the component supply unit, and the like are performed in a state of being wound around the reel (in a state of being a roll body with reel).

In such a tape feeder, the reel is a standard product, and it is difficult to reduce a size in a width direction of the reel, and an empty reel is generated after the use of the carrier tape is finished, and it takes time and effort to process and store the reel. For this reason, there has been proposed a device capable of supplying a carrier tape to a component supply unit in a state of a roll body in which a reel is eliminated and the carrier tape is wound in a roll shape (for example, PTL 1 below). In PTL 1, a roll body of a carrier tape is put into a storage part of a component supply unit from means for refilling components (component supply means), and an unnecessary reel does not remain at a mounting work site after the component supply unit finishes pulling out the carrier tape.

CITATION LIST

Patent Literature

PTL 1: Unexamined Japanese Patent Publication No. H5-21990

SUMMARY OF THE INVENTION

Therefore, an object of the present disclosure is to provide a carrier tape processing device and a carrier tape processing method capable of realizing a component supply form without a reel with an inexpensive configuration.

A carrier tape processing device of the present disclosure includes a roll body taking-out unit that takes out a roll body from a holding body that holds a carrier tape storing components in a state of the roll body and stores the roll body in a case.

A carrier tape processing method of the present disclosure includes a roll body taking-out and storing step of taking out a roll body from a holding body that holds a carrier tape storing components in a state of the roll body and storing the roll body in a case.

A carrier tape processing device of the present disclosure includes a roll body taking-out unit that takes out a roll body from a holding body that holds a carrier tape storing components in a state of the roll body and stores the roll body in a case including a storage unit, a component information acquisition unit that acquires component information that is information on components, and a writing unit that writes the component information acquired by the component information acquisition unit in the storage unit.

A carrier tape processing method of the present disclosure includes a roll body taking-out and storing step of taking out a roll body from a holding body that holds a carrier tape storing components in a state of the roll body and storing the roll body in a case including a storage unit, and a writing step of writing component information that is information on components, in the storage unit.

According to the present disclosure, a component supply form without a reel can be realized with an inexpensive configuration.

BRIEF DESCRIPTION OF THE DRAWINGS

FIG. 12A is a diagram for describing an operation of disassembling the reel by the carrier tape processing device according to the exemplary embodiment of the present disclosure.

FIG. 12B is a diagram for describing an operation of disassembling the reel by the carrier tape processing device according to the exemplary embodiment of the present disclosure.

FIG. 12C is a diagram for describing an operation of disassembling the reel by the carrier tape processing device according to the exemplary embodiment of the present disclosure.

DESCRIPTION OF EMBODIMENT

Before describing exemplary embodiments of the present disclosure, a problem in a conventional device will be briefly described.

The device described in PTL 1 requires a large-scale device (component supply unit) for supplying the roll body of the carrier tape to the component supply unit, and has a problem of cost.

Figure 1:
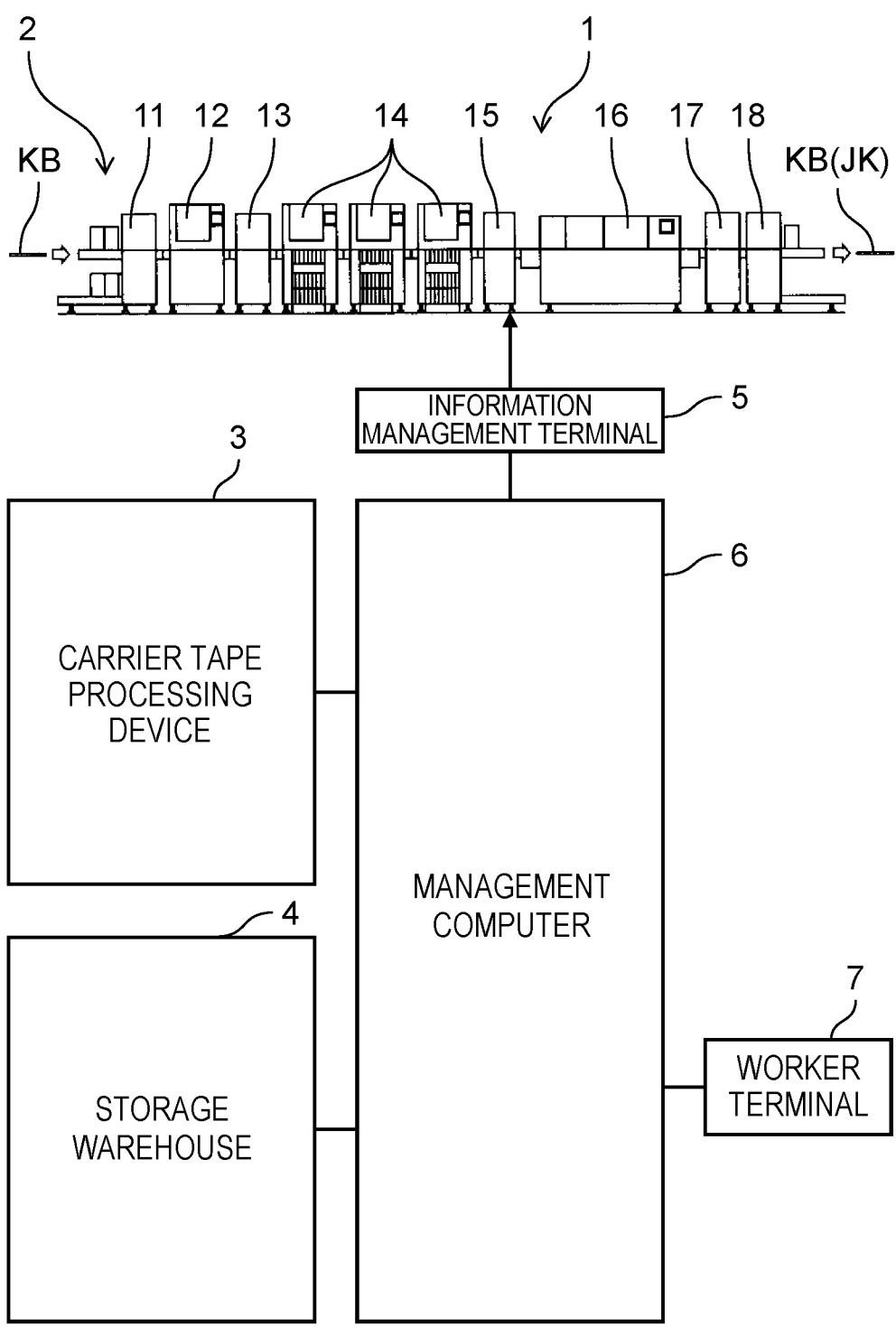
FIG. 1 is a schematic configuration diagram of a component mounting system according to an exemplary embodiment of the present disclosure.

Hereinafter, an exemplary embodiment of the present disclosure will be described with reference to the drawings. FIG. 1 is a configuration diagram of component mounting system 1 including a carrier tape processing device according to an exemplary embodiment of the present disclosure. Component mounting system 1 includes manufacturing line 2, carrier tape processing device 3 related to supply of components supplied to manufacturing line 2, and storage warehouse 4 related to storage and management of components. Manufacturing line 2 manufactures mounting substrate JK in which components are mounted on substrate KB by performing work while transferring substrate KB between a plurality of devices connected in series.

In FIG. 1, manufacturing line 2 is connected to management computer 6 through information management terminal 5. Management computer 6 manages an operation of each device constituting manufacturing line 2 from management computer 6. Further, as illustrated in FIG. 1, carrier tape processing device 3 and storage warehouse 4 are also connected to management computer 6. Management computer 6 also manages operations of carrier tape processing device 3 and storage warehouse 4. As illustrated in FIG. 1, worker terminal 7 is connected to management computer 6, and a worker of component mounting system 1 can perform various operation inputs from worker terminal 7 to component mounting system 1.

First, manufacturing line 2 will be described. In FIG. 1, manufacturing line 2 includes substrate supply device 11, printing device 12, post-printing inspection device 13, a plurality of component mounting devices 14, post-mounting inspection device 15, reflow device 16, final inspection device 17, and substrate recovery device 18.

Substrate supply device 11 sequentially supplies substrate KB to printing device 12 on a downstream side. Printing device 12 carries in substrate KB supplied from substrate supply device 11, applies paste solder to an electrode formed on a surface of substrate KB, and carries out substrate KB to post-printing inspection device 13 on the downstream side. Post-printing inspection device 13 carries in substrate KB carried out from printing device 12, and inspects substrate KB by observing with a camera whether or not there is a place with a defective solder application state, and then carries out substrate KB to component mounting devices 14 on the downstream side.

Each of component mounting devices 14 mounts the component on substrate KB carried in from an upstream side and carries out the component to the downstream side. Component mounting device 14 located on the most downstream side carries out substrate KB to post-mounting inspection device 15 located on the downstream side. Component mounting device 14 will be described later.

Post-mounting inspection device 15 carries in substrate KB carried out from component mounting device 14 located on the most downstream side, inspects substrate KB by observing with a camera whether or not there is a place where the component is mounted in a defective state, and then carries out substrate KB to reflow device 16 on the downstream side. Reflow device 16 carries in substrate KB carried out from post-mounting inspection device 15, and causes substrate KB to pass through a reflow furnace to melt and solidify the solder, thereby bonding the component to the electrode. Final inspection device 17 carries in substrate KB that has passed through reflow device 16, observes the bonding state of the component to the electrode with a camera to inspect the bonding state, and then carries out substrate KB to substrate recovery device 18 on the downstream side. Substrate recovery device 18 receives and recovers substrate KB carried out from final inspecting device 17.

Figure 2:
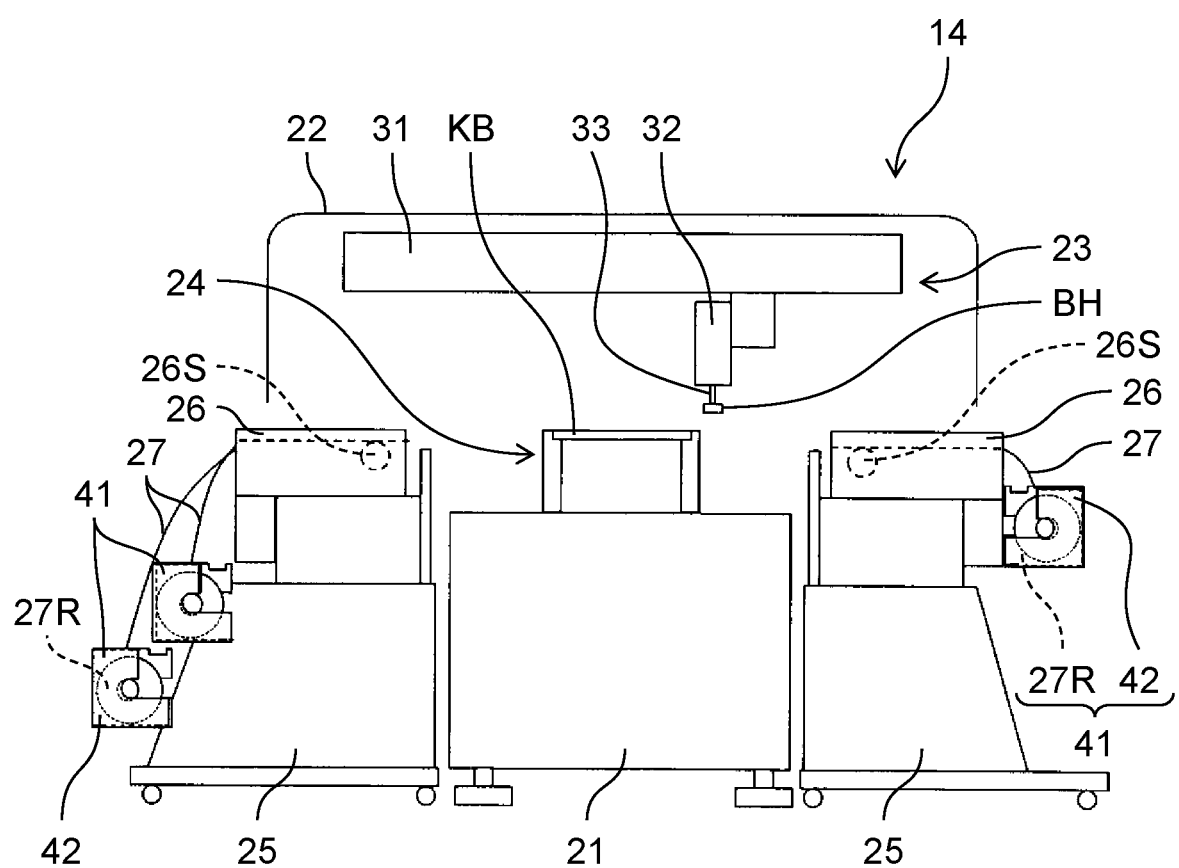
FIG. 2 is a side view of a component mounting device included in the component mounting system according to the exemplary embodiment of the present disclosure.

Next, component mounting device 14 will be described with reference to FIG. 2. In FIG. 2, base cover 22 is provided on base 21 of component mounting device 14, and substrate transport path 24 that conveys substrate KB in a horizontal direction is provided in working space 23 between base 21 and base cover 22.

Feeder carriages 25 are connected to positions on both sides of substrate transport path 24 on base 21. A plurality of component supply units 26 are attached to each of feeder carriages 25. Here, component supply unit 26 is a tape feeder, and supplies components BH one by one to a predetermined component supply position by conveying carrier tape 27 by sprocket 26S.

In FIG. 2, mounting head 32 that is moved in a horizontal plane direction by head moving mechanism 31 is provided in working space 23. Component suction nozzle 33 is provided to extend downward in mounting head 32. Component BH supplied by component supply unit 26 is sucked to a lower end of component suction nozzle 33.

When substrate transport path 24 carries in substrate KB from the upstream side and positions substrate KB, each component mounting device 14 causes mounting head 32 to repeatedly perform the mounting turn while causing component supply unit 26 to supply component BH. In one mounting turn, mounting head 32 performs an operation of sucking and picking up component BH supplied by component supply unit 26 and an operation of mounting component BH at a predetermined component mounting position on substrate KB in this order. When all components BH to be mounted on substrate KB are mounted by repeatedly performing the mounting turns on mounting head 32, substrate transport path 24 is operated to carry out substrate KB to the downstream side.

Here, in the present exemplary embodiment, carrier tape 27 used by component mounting device 14 for supplying component BH is fed out from roll body 41 in a case. Here, "roll body 41 in a case" refers to roll body 27R in which carrier tape 27 is rolled and stored in case 42 (see also FIG. 3). Roll body 41 in a case is different from roll body 43 with a reel (FIG. 4) that is conventionally used. Here, "roll body 43 with a reel" refers to roll body 27R held by reel 44.

Figure 5:
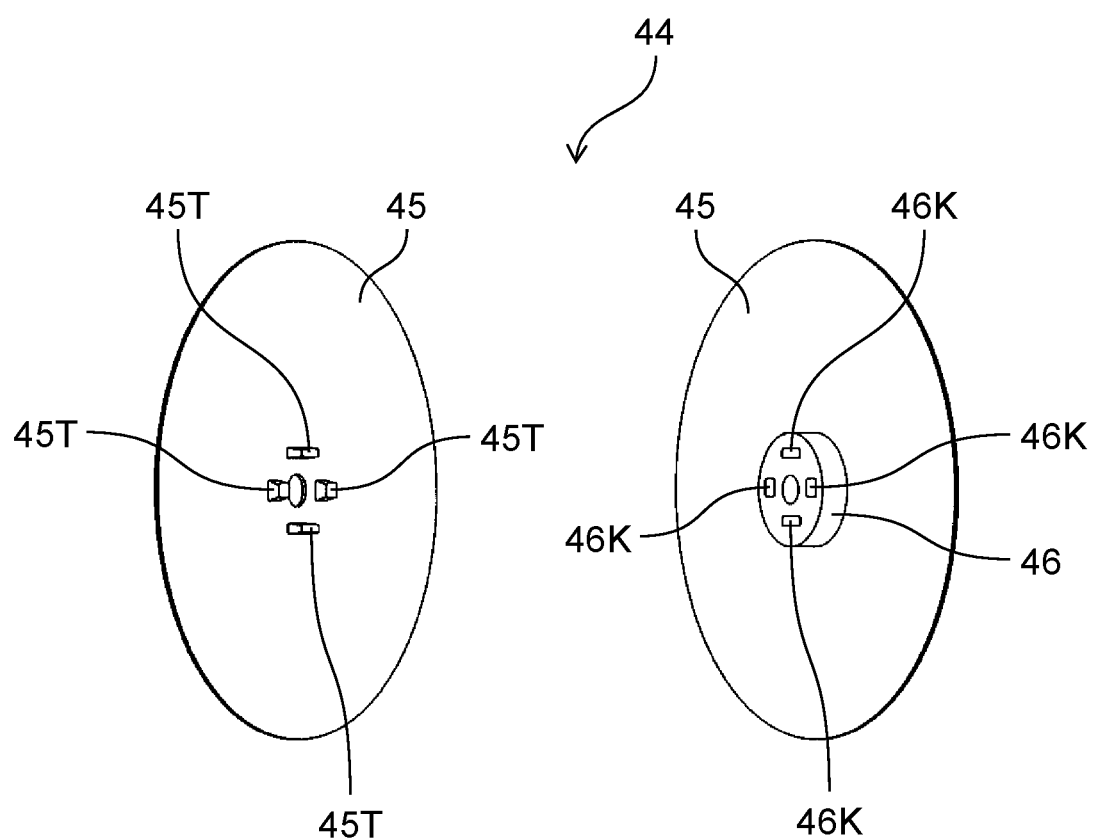
FIG. 5 is an exploded view of a reel of the roll body with a reel used when a carrier tape processing device according to the exemplary embodiment of the present disclosure manufactures the roll body in a case.

In the present exemplary embodiment, reel 44 of roll body 43 with a reel is assumed to have two side plates 45 and winding core 46 disposed between two side plates 45 as illustrated in FIG. 5. In the present exemplary embodiment, it is assumed that winding core 46 is coupled to one of side plates 45. It is assumed that a plurality of recesses 46K provided in winding core 46 of one of side plates 45 and a plurality of protrusions 45T provided on a side of the other of side plates 45 are fitted to each other to connect two side plates 45. Therefore, when reel 44 is disassembled in the present exemplary embodiment, reel 44 is divided into two parts, a part including one of side plates 45 and a part including the other of side plates 45.

Figure 6A:
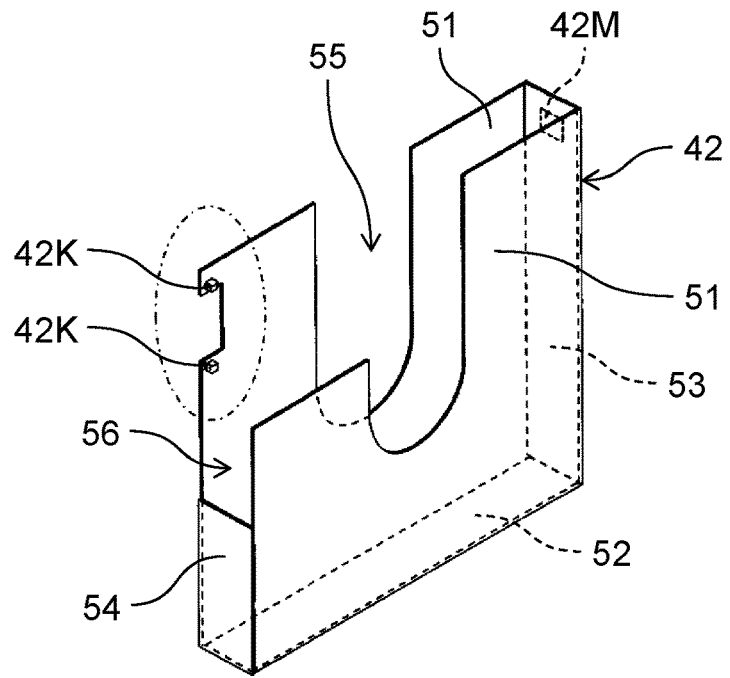
FIG. 6A is a perspective view of a case used when the carrier tape processing device according to the exemplary embodiment of the present disclosure manufactures a roll body in a case.
Figure 6B:
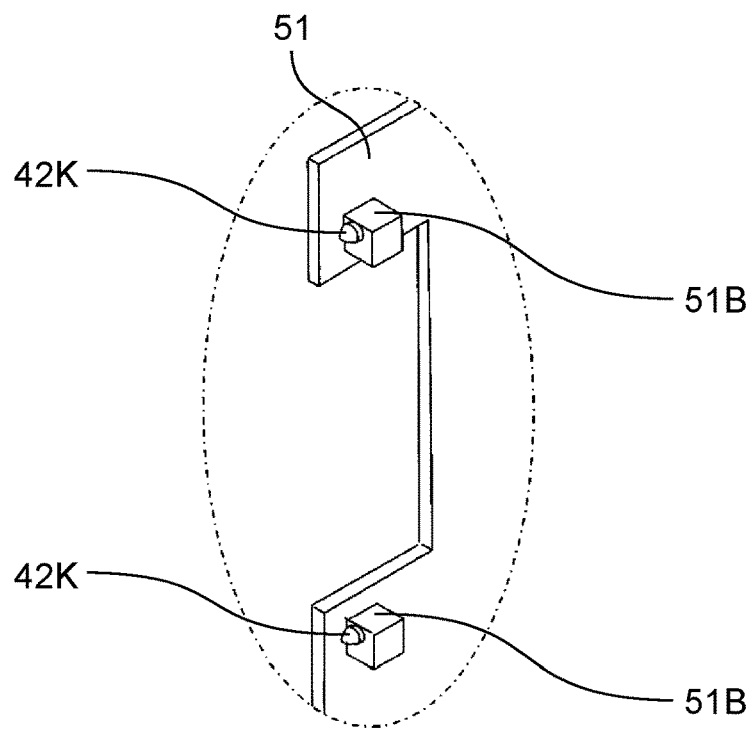
FIG. 6B is a partially enlarged view of a case used when the carrier tape processing device according to the exemplary embodiment of the present disclosure manufactures the roll body in a case.

Here, case 42 of roll body 41 in a case will be described. As illustrated in FIG. 6A, case 42 includes left and right side walls 51, bottom wall 52, front wall 53, and rear wall 54, and includes upper opening 55 and rear opening 56. Radio tag 42M is attached to an outer surface of front wall 53. Two upper and lower projection bases 51B projecting inward from an inner surface of one of side walls 51 are provided on an upper part of rear wall 54, and two projection bases 51B are provided with tape tip end holding parts 42K projecting outward in the horizontal direction (FIG. 6B).

Figure 7A:
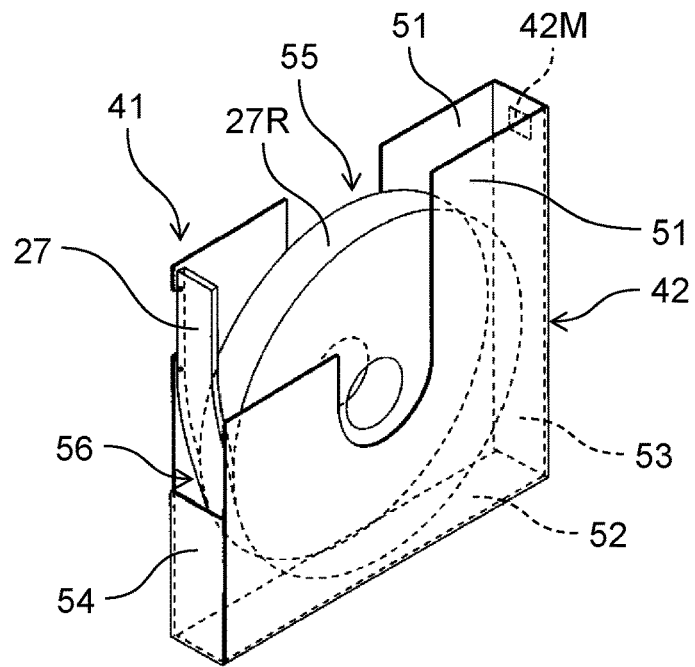
FIG. 7A is a perspective view of a roll body in a case manufactured by the carrier tape processing device according to the exemplary embodiment of the present disclosure.
Figure 7B:
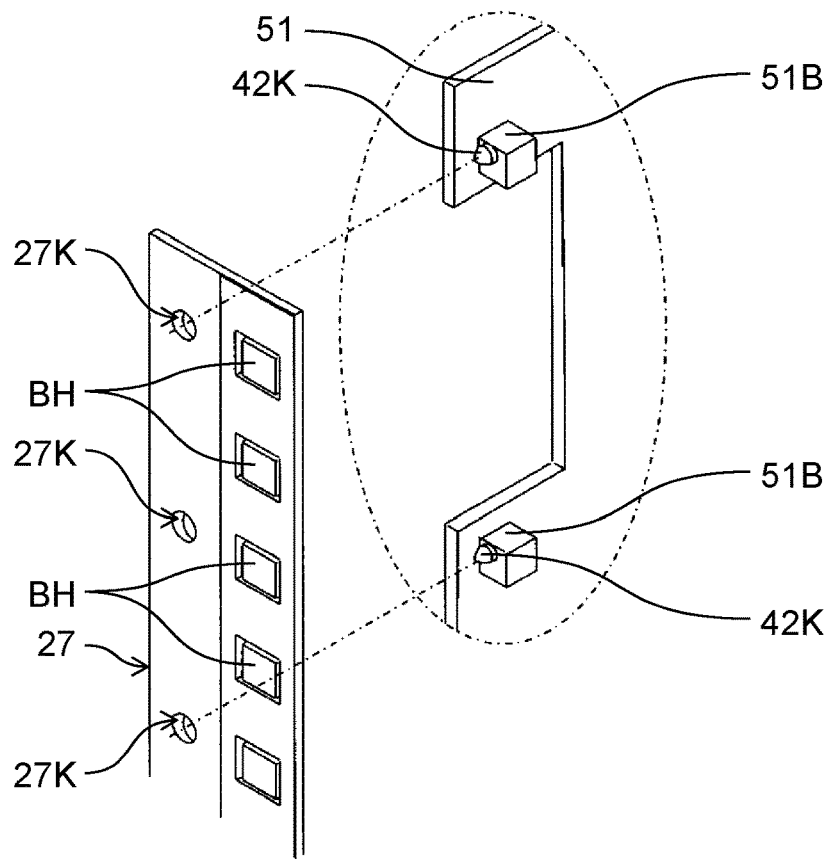
FIG. 7B is a partially enlarged view of the roll body in a case manufactured by the carrier tape processing device according to the exemplary embodiment of the present disclosure.

As illustrated in FIGS. 7A and 7B, when roll body 41 in a case is stored or transported, tape tip end holding part 42K provided in case 42 is inserted into feed hole 27K (hole engaged with an outer peripheral teeth of sprocket 26S) of carrier tape 27 to be locked. Note that the case where roll body 41 in a case is stored or transported refers to a case where roll body 27R is stored in case 42, and a case where carrier tape 27 is not pulled out from roll body 27R to be used. In the present exemplary embodiment, two tape tip end holding parts 42K provided in case 42 are inserted into and locked to two feed holes 27K. This prevents carrier tape 27 from coming off from case 42 of roll body 41 in a case during storage or transportation, and thus prevents entire roll body 27R from falling off from case 42.

Figure 3:
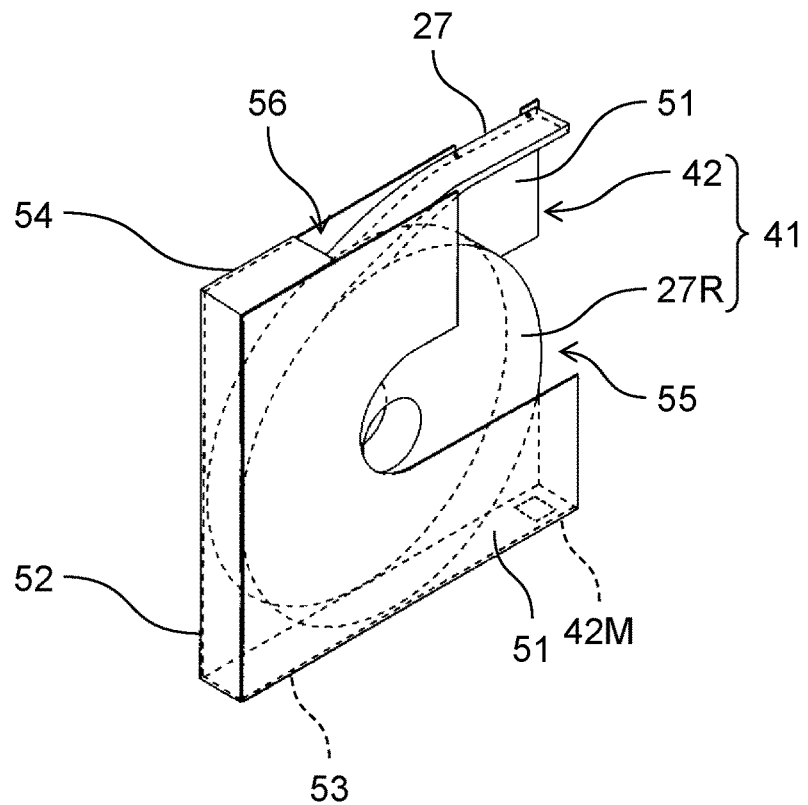
FIG. 3 is a perspective view of a roll body in a case used in the component mounting device according to the exemplary embodiment of the present disclosure.
Figure 4:
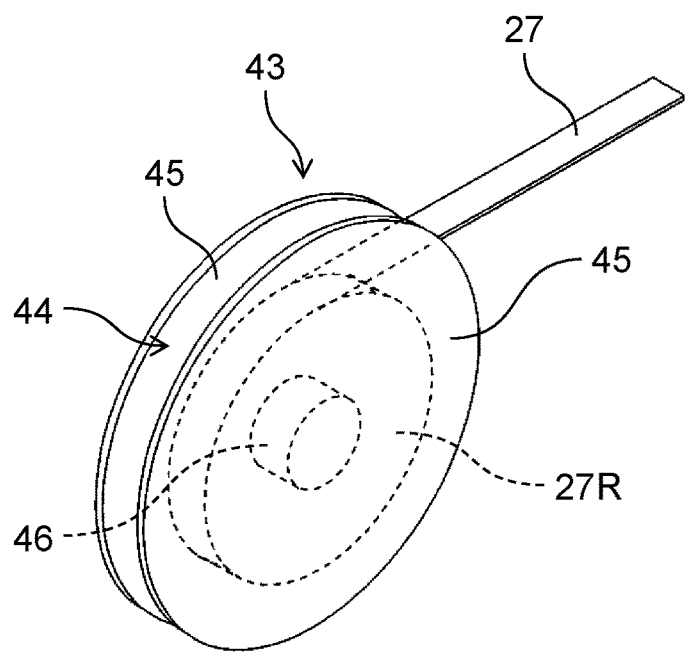
FIG. 4 is a perspective view of a roll body with a reel according to the exemplary embodiment of the present disclosure.

On the other hand, when carrier tape 27 is pulled out from roll body 41 in a case for use, two tape tip end holding parts 42K are removed from feed hole 27K of carrier tape 27, and furthermore, front wall 53 is brought into an attitude to be a lower surface as illustrated in FIG. 3. Carrier tape 27 can be fed to component supply unit 26 by pulling out carrier tape 27 from rear opening 56 in such an attitude that front wall 53 is a lower surface. As described above, by providing tape tip end holding part 42K in case 42, a position of a tip end part of carrier tape 27 in case 42 is unified, so that the operation of taking out the tip end part of carrier tape 27 from case 42 can be easily performed. Further, it is possible to easily cope with a case where the work of taking out the tip end part of carrier tape 27 is performed by an automated facility such as a robot.

Figure 8A:
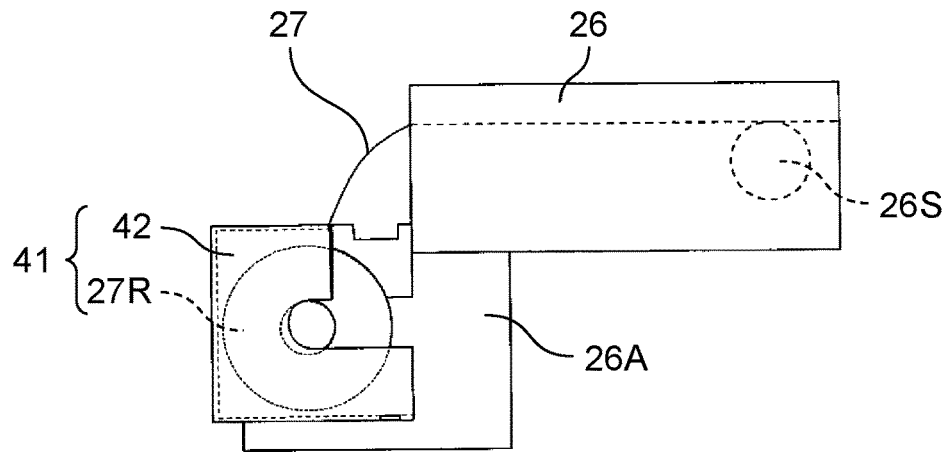
FIG. 8A is a diagram illustrating a usage mode of the roll body in a case manufactured by the carrier tape processing device according to the exemplary embodiment of the present disclosure.
Figure 8B:
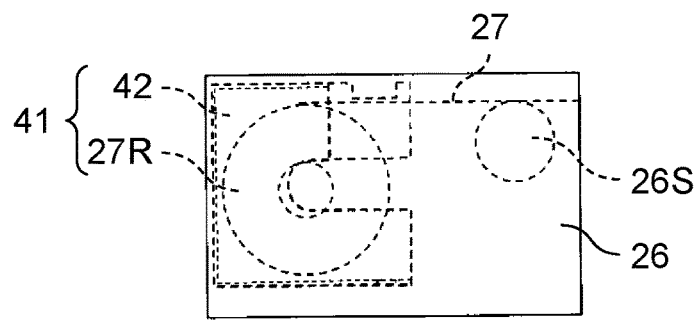
FIG. 8B is a diagram illustrating a usage mode of the roll body in a case manufactured by the carrier tape processing device according to the exemplary embodiment of the present disclosure.
Figure 8C:
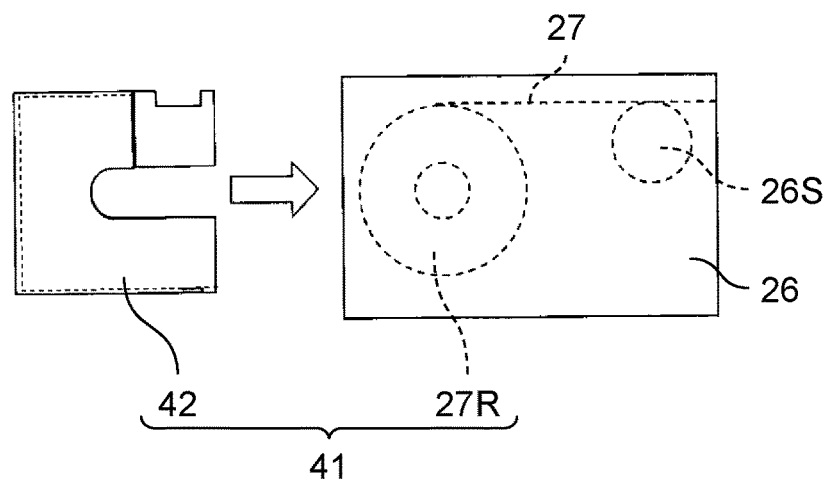
FIG. 8C is a diagram illustrating a usage mode of the roll body in a case manufactured by the carrier tape processing device according to the exemplary embodiment of the present disclosure.

As a usage mode of roll body 41 in a case with respect to component supply unit 26, for example, there is a mode of being attached to feeder carriage 25 as in roll body 41 in a case illustrated on a left side of FIG. 2, and a mode of being attached to component supply unit 26 via attachment 26A as in roll body 41 in a case illustrated on a right side of FIG. 2 and FIG. 8A. Alternatively, as illustrated in FIG. 8B, entire roll body 41 in a case may be stored inside component supply unit 26. Alternatively, as illustrated in FIG. 8C, there is also a mode in which roll body 27R is taken out from roll body 41 in a case, and only roll body 27R is stored inside component supply unit 26.

As described above, in the present exemplary embodiment, case 42 of roll body 41 in a case can have a role of a support means of roll body 27R when roll body 27R is installed outside component supply unit 26 to be used (a role of reel 44 in roll body 43 with a reel).

Next, carrier tape processing device 3 will be described. Carrier tape processing device 3 is a device that processes carrier tape 27 used in component mounting device 14 to manufacture roll body 41 in a case. Carrier tape processing device 3 is configured to take out roll body 27R from reel 44 of conventional roll body 43 with a reel, store roll body 27R in case 42, and recover reel 44.

Figure 9:
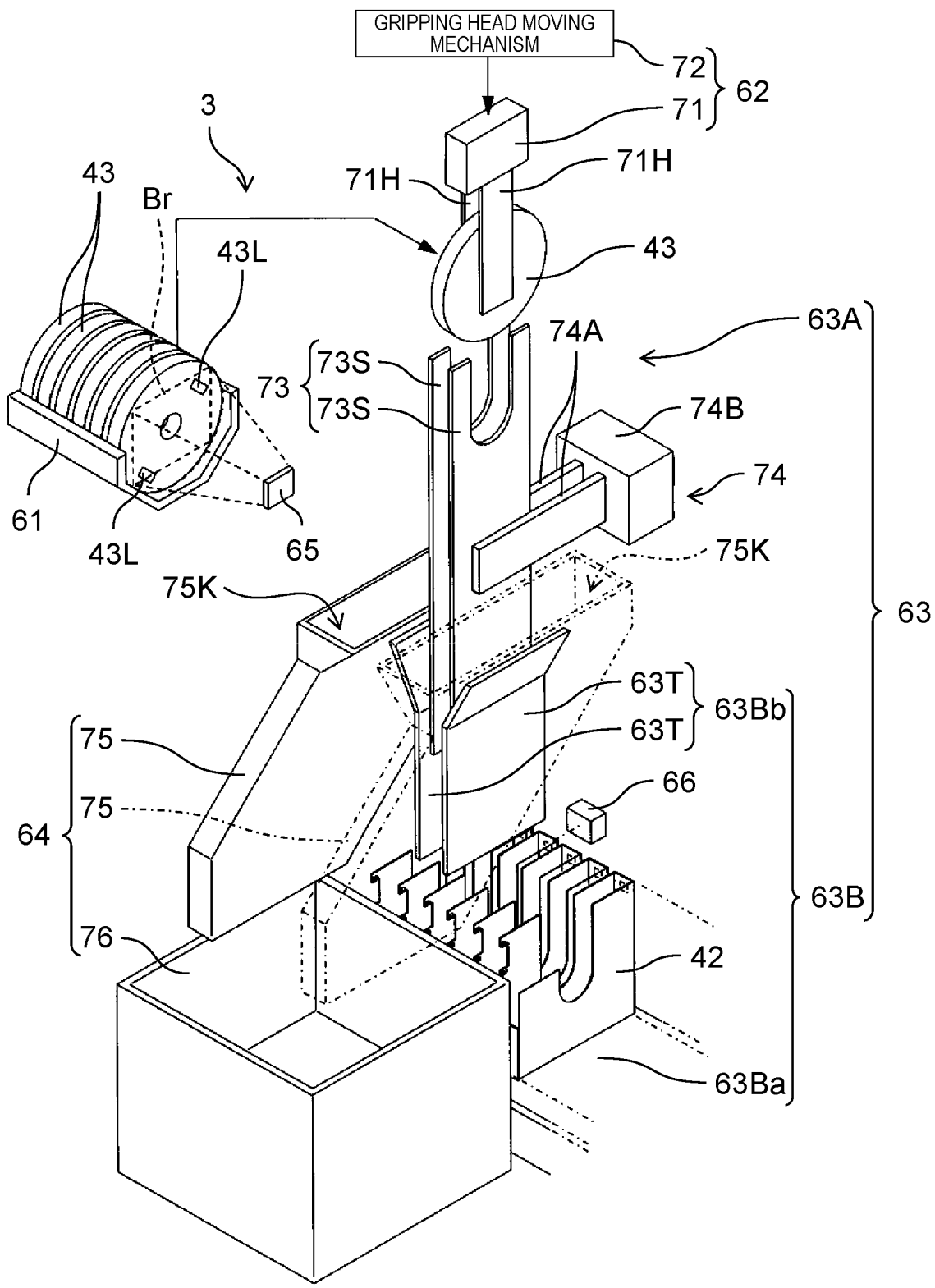
FIG. 9 is a perspective view of the carrier tape processing device according to the exemplary embodiment of the present disclosure.
Figure 10:
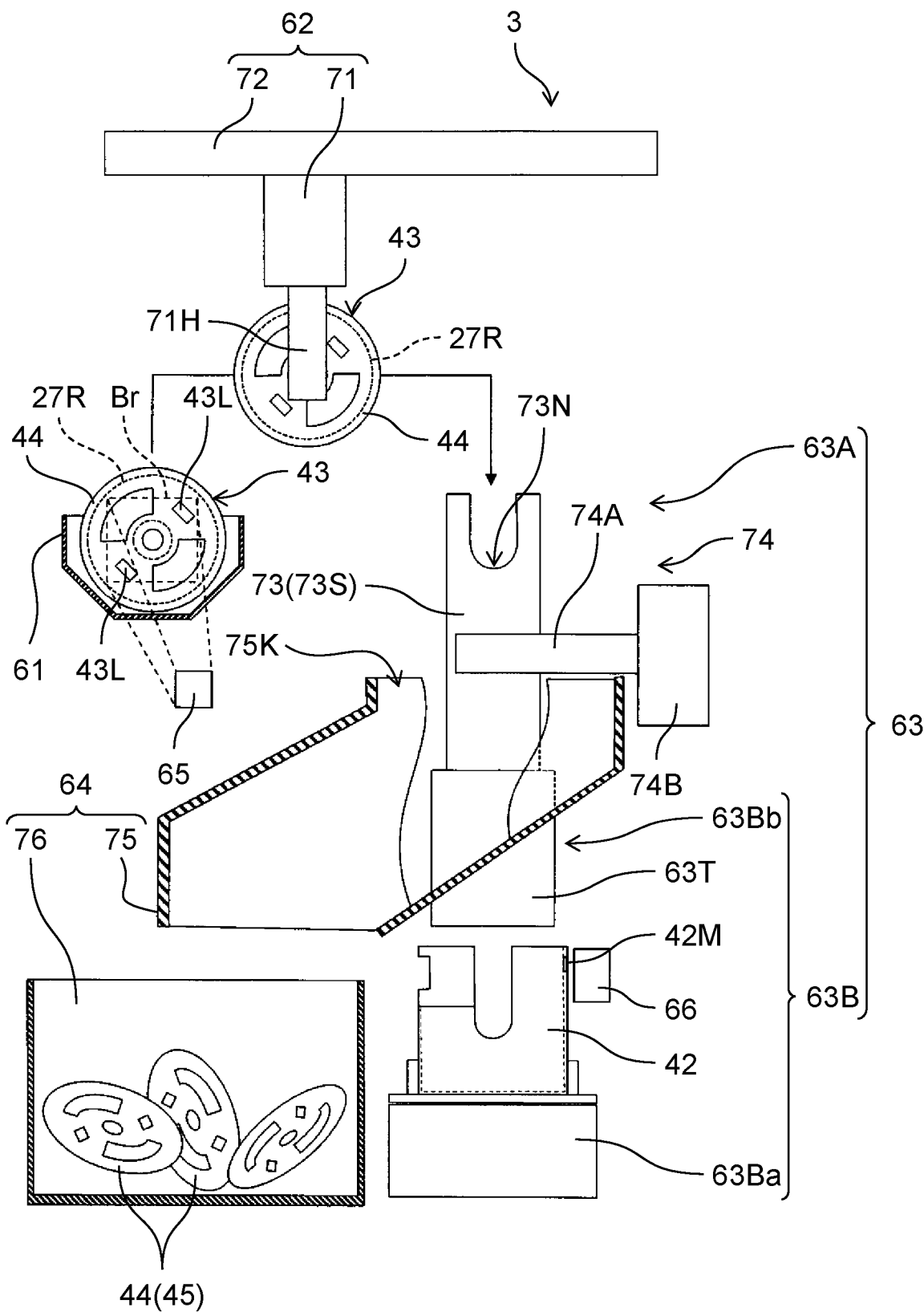
FIG. 10 is a side view of the carrier tape processing device according to the exemplary embodiment of the present disclosure.
Figure 11:
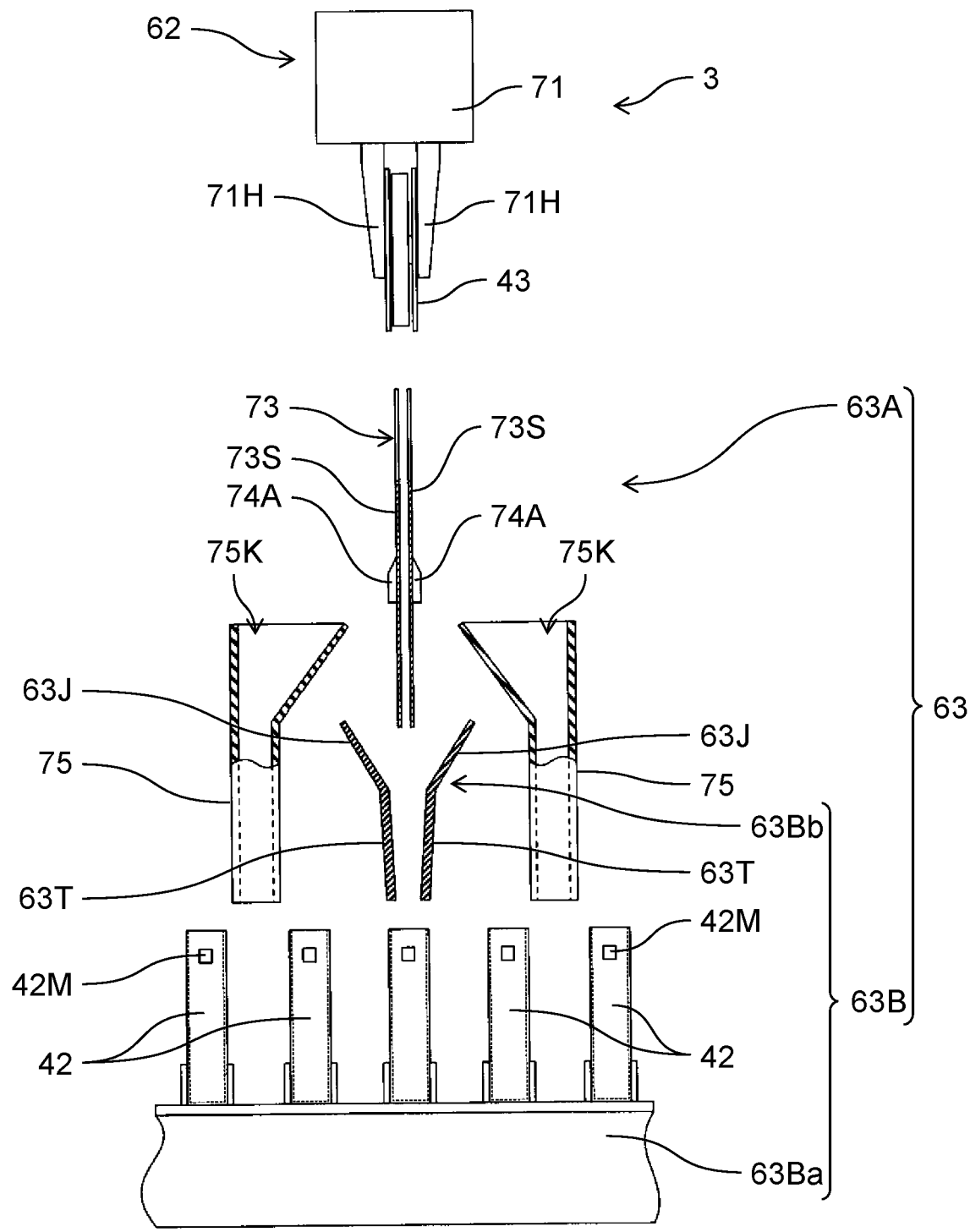
FIG. 11 is a front view of a main part of the carrier tape processing device according to the exemplary embodiment of the present disclosure.

As illustrated in FIGS. 9, 10, and 11, carrier tape processing device 3 according to the present exemplary embodiment includes reel supply unit 61, reel conveyance unit 62, roll body taking-out unit 63, recovery unit 64, reading unit 65, and writing unit 66.

Reel supply unit 61 has a function of supplying roll body 43 with a reel. As illustrated in FIGS. 9 and 10, reel supply unit 61 includes, for example, a container-shaped member opened upward, and holds a plurality of roll bodies 43 with reels in a state of being arranged in a lateral direction.

Reel conveyance unit 62 has a function of gripping roll body 43 with a reel supplied by reel supply unit 61 and moving the roll body with a reel upward from roll body taking-out unit 63. As illustrated in FIGS. 9 and 10, reel conveyance unit 62 includes gripping head 71 and gripping head moving mechanism 72. Gripping head 71 grips roll body 43 with a reel supplied by reel supply unit 61 by two gripping parts 71H extending downward. Gripping head moving mechanism 72 moves gripping head 71 gripping roll body 43 with a reel in the horizontal plane direction and the vertical direction.

Roll body taking-out unit 63 has a function of taking out roll body 27R from reel 44 of roll body 43 with a reel, and storing the taken-out roll body in case 42. Roll body taking-out unit 63 includes separation unit 63A that separates roll body 27R from reel 44 of roll body 43 with a reel, and roll body storage unit 63B that stores roll body 27R separated from reel 44 by separation unit 63A in case 42.

As illustrated in FIGS. 9 and 10, separation unit 63A includes separator 73 and separator driver 74. Separator 73 includes a pair of movable plates 73S facing each other in the horizontal direction and extending in the vertical direction. Each of movable plates 73S is provided with U-shaped escape part 73N recessed downward from an upper edge part (FIG. 10).

In FIGS. 9 and 10, separator driver 74 includes a pair of (two) arm parts 74A and arm driver 74B that moves two arm parts 74A. One end parts of two arm parts 74A are attached to two movable plates 73S, respectively, and extend in the substantially horizontal direction. Arm driver 74B can change an interval between two arm parts 74A (and thus separator 73) by moving two arm parts 74A in the horizontal direction.

In FIGS. 9 and 10, roll body storage unit 63B includes case holding part 63Ba and chute part 63Bb. Roll body storage unit 63B has a function of holding empty case 42 and conveying the same in the horizontal direction. Chute part 63Bb has a function of guiding roll body 27R such that roll body 27R separated from reel 44 by separation unit 63A is stored one by one in empty case 42 held by case holding part 63Ba.

As illustrated in FIGS. 9, 10, and 11, case holding part 63Ba includes a conveyor mechanism extending in the horizontal direction. Case holding part 63Ba holds each of the plurality of cases 42 in a state of being arranged in a line such that upper opening 55 faces upward, and intermittently conveys the same in the horizontal direction.

As illustrated in FIGS. 9, 10, and 11, chute part 63Bb includes a pair of (two) chute members 63T. Two chute members 63T are arranged to face each other in a direction in which two movable plates 73S constituting separator 73 face each other. Two chute members 63T are disposed below separator 73.

In FIG. 11, each of two chute members 63T has a shape in which upper end part 63J expands upward. An interval between the upper end parts of two chute members 63T is wider than an interval between the lower ends of two movable plates 73S constituting separator 73. Further, an interval between two chute members 63T becomes narrower toward the lower end side (FIG. 11).

Chute part 63Bb guides roll body 27R separated from reel 44 by reel 44 being disassembled by separation unit 63A downward, thereby storing roll body 27R in case 42 located below the chute part. Accordingly, one roll body 27R is stored in one case 42.

Recovery unit 64 has a function of recovering reel 44 disassembled by separation unit 63A. As illustrated in FIGS. 9 and 10, recovery unit 64 includes a pair of reel discharge chutes 75 and recovery box 76.

Two reel discharge chutes 75 have a tubular shape in which an opening part becomes wider toward an upper side. Upper end opening 75K of each of two reel discharge chutes 75 is located on the side of separator 73 (the side of each of two movable plates 73S). Recovery box 76 is a container-shaped member opened upward, and is provided below two reel discharge chutes 75.

When reel 44 is disassembled by separation unit 63A, first, roll body 43 with a reel gripped by gripping head 71 of reel conveyance unit 62 is positioned above separator 73 (FIG. 11). Then, after the interval between the upper end parts of two movable plates 73S constituting separator 73 is set to be smaller than the interval between two side plates 45 constituting reel 44 of roll body 43 with a reel (arrow A in FIG. 12A), gripping head 71 is lowered relative to separator 73 so that the upper end parts of two movable plates 73S are inserted between two side plates 45 from below (arrow B in FIG. 12A).

When the upper end part of each of two movable plates 73S is inserted between two side plates 45 from below, arm driver 74B operates to increase the interval between two movable plates 73S. At this time, the interval between two movable plates 73S is set to be larger than the interval between two side plates 45 (arrow C illustrated in FIG. 12B).

As a result, movable plate 73S pushes and spreads side plate 45 outward to widen a gap between side plate 45 and roll body 27R.

When the interval between side plate 45 and roll body 27R increases by increasing the interval between two movable plates 73S (FIG. 12B), gripping head 71 is further lowered relative to separator 73 (arrow D illustrated in FIG. 12C). Thus, each of two movable plates 73S is inserted into the gap between widened side plate 45 and roll body 27R. At this time, winding core 46 enters escape part 73N formed in each of movable plates 73S.

Figure 13:
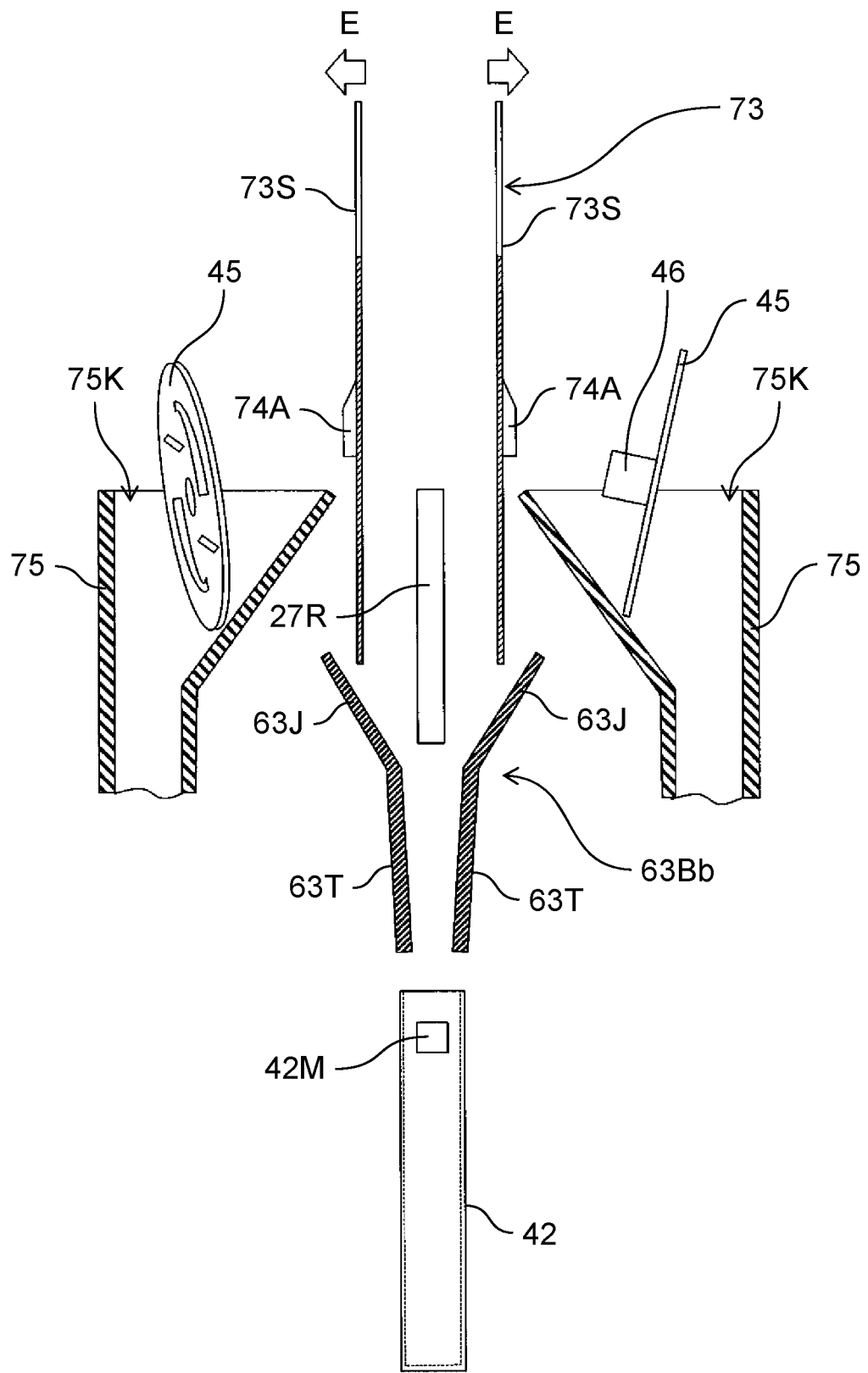
FIG. 13 is a diagram illustrating a state immediately after the reel is disassembled by the carrier tape processing device according to the exemplary embodiment of the present disclosure.

When each of two movable plates 73S is inserted between side plate 45 and roll body 27R, arm driver 74B further widens the interval between two movable plates 73S (arrow E illustrated in FIG. 13). As a result, two side plates 45 are pulled off, and the plurality of recesses 46K provided on winding core 46 of one of side plates 45 and the plurality of protrusions 45T provided on the other of side plates 45 are separated (FIG. 13). As a result, reel 44 is divided into two parts, that is, a part including one of side plates 45 and a part including the other of side plates 45. Roll body 27R separated from reel 44 passes between two chute parts 63Bb constituting roll body storage unit 63B and is stored in empty case 42 located immediately below roll body storage unit 63B.

On the other hand, side plate 45 on one side of two divided reels 44 falls into upper end opening 75K of reel discharge chute 75 on one side, and side plate 45 on the other side falls into upper end opening 75K of reel discharge chute 75 on the other side (FIG. 13). Each of these two side plates 45 falls through reel discharge chute 75, enters recovery box 76, and is recovered.

In FIG. 9, reading unit 65 includes a reader or a camera that optically reads an identifier (symbol) such as a barcode or a two-dimensional code printed (recorded) on the outer surface of reel 44, and is provided in the vicinity of reel supply unit 61. The identifier includes component information of component BH stored in carrier tape 27. In the present exemplary embodiment, reading unit 65 reads the code printed on code label 43L (FIGS. 9 and 10) attached to reel 44 of roll body 43 with a reel held by reel supply unit 61 to acquire (read) the component information. Broken line Br in FIGS. 9 and 10 schematically indicates a reading range of reading unit 65. Here, the "component information" is information regarding component BH stored in carrier tape 27 of roll body 43 with a reel, and may include at least one of a type of component BH, a component name, characteristics, a date of manufacture, a manufacturer, an expiration date, the number of components, and access information (URL or the like) for accessing these pieces of information.

As described above, in the present exemplary embodiment, reading unit 65 is a component information acquisition unit that acquires component information that is information on components stored in carrier tape 27. Note that, in a case where reel 44 has a radio tag storing component information, a non-contact reader having a function of reading the information of the radio tag in a non-contact manner may be used as reading unit 65. Reading unit 65 reads the component information from reel 44 of reel supply unit 61, but may read the component information from reel 44 gripped by gripping head 71. In the present exemplary embodiment, reading unit 65 is disposed at a position where an identifier of reel 44 of reel supply unit 61 can be read. However, the reading unit may be disposed at any position as long as the identifier can be read. Further, it may be mounted on gripping head 71 or a robot arm (not illustrated) so as to be movable. Further, reading unit 65 may be configured by a wireless or wired hand scanner, and the identifier of reel 44 may be read by an operation of operator OP (see FIG. 14).

Writing unit 66 writes information in radio tag 42M attached to case 42 held by case holding part 63Ba by radio communication. The information written in radio tag 42M by writing unit 66 is the component information acquired (read) by reading unit 65 and the identification information.

Here, the "identification information" is information used to identify component BH stored in one roll body 27R used in component mounting system 1 from component BH stored in another roll body 27R. The identification information includes, for example, a serial number issued in a factory in which component mounting system 1 is installed. In the present exemplary embodiment, as described later, the identification information is generated (issued) by management computer 6 when roll body 27R separated from reel 44 is stored in case 42. Further, the identification information is also used as management information for managing case 42. That is, the identification information is used for both the purpose of identifying roll body 27R and the purpose of identifying case 42.

Next, storage warehouse 4 will be described. Storage warehouse 4 stores roll body 41 in a case. Roll body 41 in a case referred to herein includes not only roll body 41 in a case just manufactured by carrier tape processing device 3 but also in-use roll body 41 in a case that has been used in component mounting device 14 and returned halfway.

Figure 14:
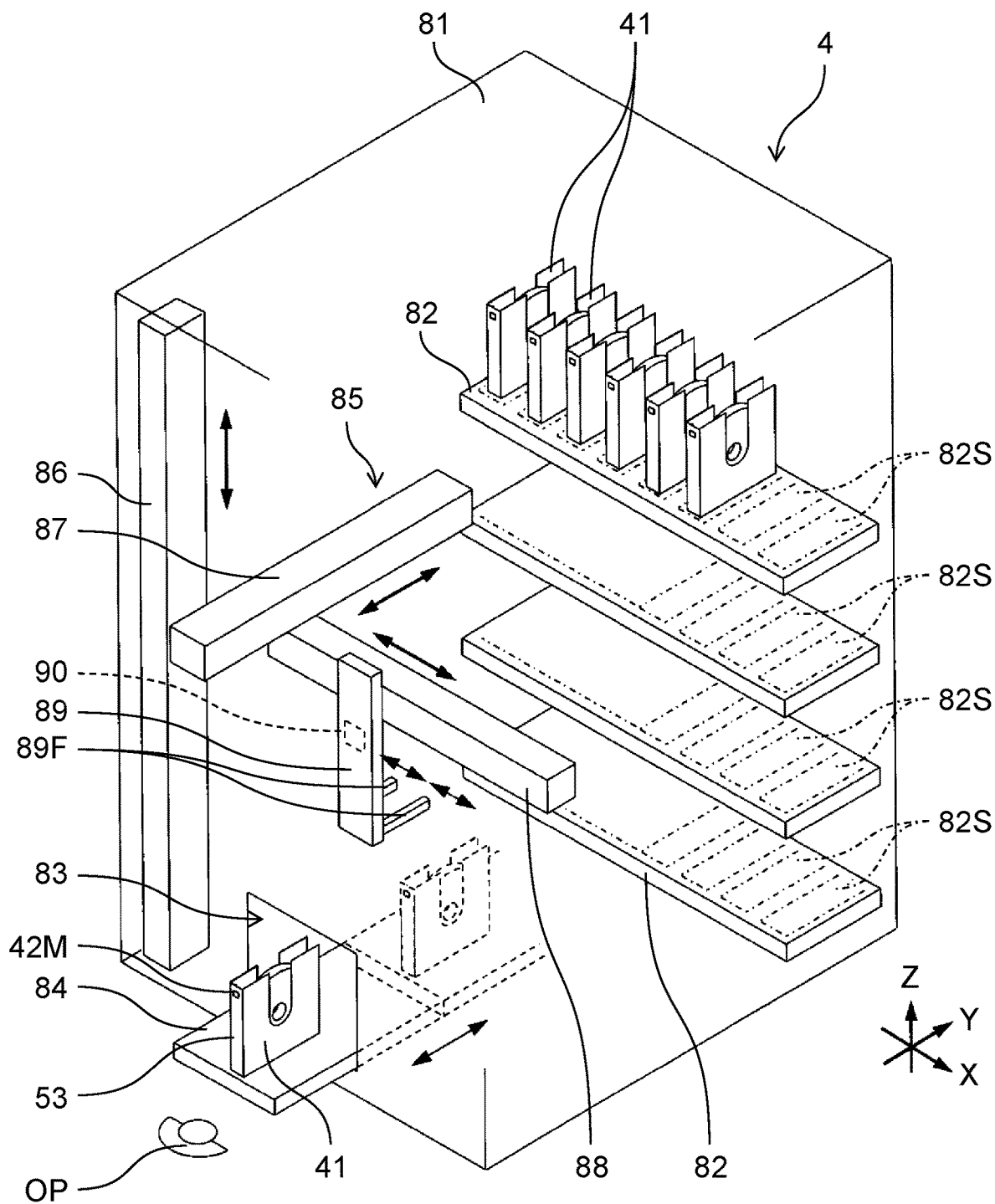
FIG. 14 is a perspective view of a storage warehouse according to the exemplary embodiment of the present disclosure.

In FIG. 14, storage warehouse 4 has a plurality of shelf parts 82 (storage parts) in housing 81. Inlet 83 is provided below a front surface of housing 81, and moving table 84 that performs an operation of protruding to the outside of housing 81 (a front side of operator OP) through inlet 83 and an operation of retracting to the inside of housing 81 (a back side as viewed from operator OP) is provided inside housing 81. Moving table 84 is overhung to the front side of operator OP when roll body 41 in a case is stored in storage warehouse 4, and is drawn to the back side when roll body 41 in a case placed on moving table 84 is housed in housing 81.

A plurality of storage positions 82S for storing (placing) roll body 41 in a case are determined in advance in each of the plurality of shelf parts 82 provided in storage warehouse 4. That is, in the present exemplary embodiment, each of shelf parts 82 is a storage part including a plurality of storage positions 82S for storing case 42 (that is, roll body 41 in a case) storing roll body 27R.

In FIG. 14, case transfer mechanism 85 is provided in housing 81. Case transfer mechanism 85 includes Z-axis table 86 extending in the vertical direction (referred to as the Z-axis direction), Y-axis table 87 extending in the front-rear direction (referred to as the Y-axis direction) as viewed from operator OP and moved in the vertical direction by Z-axis table 86, X-axis table 88 extending in the lateral direction (referred to as the X-axis direction) as viewed from operator OP and moved in the front-rear direction by Y-axis table 87, and transfer head 89 moved in the X-axis direction by X-axis table 88.

Case transfer mechanism 85 moves transfer head 89 three-dimensionally by the movement operation of Y-axis table 87 in the Z-axis direction by Z-axis table 86, the movement of X-axis table 88 in the Y-axis direction by Y-axis table 87, and the movement of transfer head 89 in the X-axis direction by X-axis table 88. Transfer head 89 includes two fingers 89F arranged in the X-axis direction.

Phase head 89 can bring two fingers 89F close to or away from each other in the X-axis direction. When two fingers 89F are actuated to close with roll body 41 in a case positioned between two fingers 89F, roll body 41 in a case is gripped by two fingers 89F (i.e., by transfer head 89).

In FIG. 14, transfer head 89 is provided with non-contact reader 90 in which an imaging visual field is directed in a depth direction as viewed from operator OP. Non-contact reader 90 faces radio tag 42M provided in case 42 of roll body 41 in a case at a position where transfer head 89 grips roll body 41 in a case.

Non-contact reader 90 reads information written in radio tag 42M (component information and identification information of component BH stored in roll body 27R) by radio communication in a state of facing radio tag 42M. In the present exemplary embodiment, non-contact reader 90 functions as an identification information reading unit that reads identification information written in radio tag 42M as a storage unit. When reading the information written in radio tag 42M of roll body 41 in a case, non-contact reader 90 stores the read information in management computer 6 (described later).

A unique address is given to each of storage positions 82S defined in each of the plurality of shelf parts 82. In the present exemplary embodiment, when roll body 41 in a case is stored (placed) in storage position 82S, information in which information (component information) on component BH stored in roll body 27R (carrier tape 27) of roll body 41 in a case is associated (so-called associated) with identification information of roll body 41 in a case is stored in management computer 6. Further, information in which the component information and the information on storage position 82S (storage position information) are associated with each other is stored in management computer 6 (described later). As a result, management computer 6 can grasp which storage position 82S of storage warehouse 4 stores which component BH in which roll body 41 in a case is stored.

Figure 15:
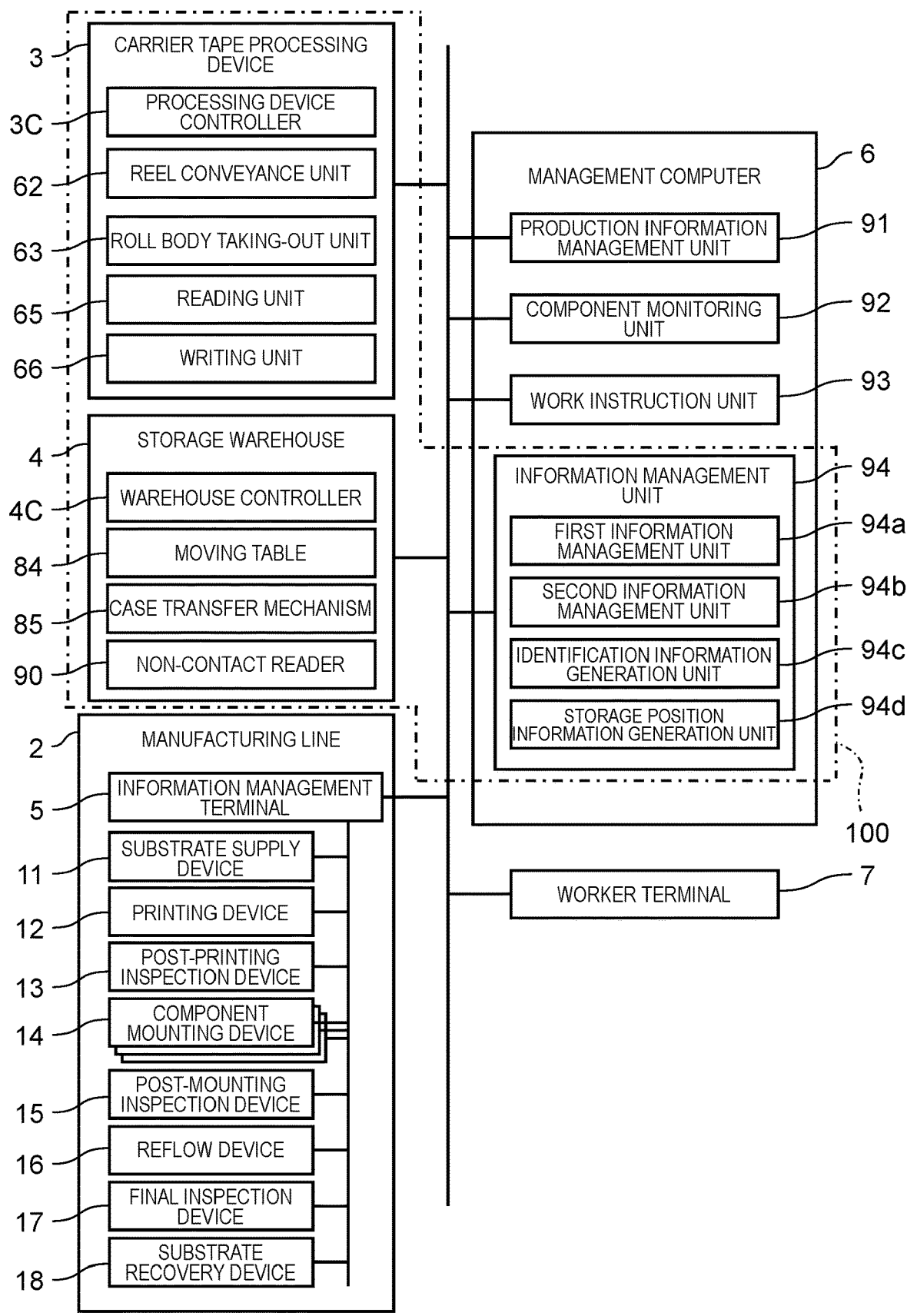
FIG. 15 is a block diagram illustrating a control system of the component mounting system according to the exemplary embodiment of the present disclosure.

FIG. 15 is a block diagram illustrating a control system in entire component mounting system 1. As illustrated in FIG. 15, management computer 6 includes production information management unit 91, component monitoring unit 92, work instruction unit 93, and information management unit 94. Production information management unit 91 stores production plan data in component mounting system 1. Component monitoring unit 92 monitors the number of remaining components BH in manufacturing line 2. When a component shortage is predicted, component monitoring unit 92 transmits the fact to work instruction unit 93.

Work instruction unit 93 gives a work instruction at the time of model switching based on the production plan data stored in production information management unit 91 to manufacturing line 2 and operator OP, and gives an instruction such as delivery of component BH to be used in production of the next model to storage warehouse 4. Work instruction unit 93 issues a work instruction (specifically, an instruction to storage warehouse 4 to dispense the component for replenishment and an instruction to operator OP to perform the component replenishment work) based on the information from component monitoring unit 92.

Information management unit 94 includes first information management unit 94a, second information management unit 94b, identification information generation unit 94c, and storage position information generation unit 94d (FIG. 15). First information management unit 94a manages the component information, and second information management unit 94b manages information (storage position information) of storage position 82S of component BH in storage warehouse 4. Specifically, first information management unit 94a stores the component information and the identification information of roll body 27R separated from reel 44 in association with each other. Further, second information management unit 94b stores the identification information on roll body 27R separated from reel 44 and the information on storage position 82S (storage position information) in association with each other.

Identification information generation unit 94c generates (issues) the identification information on roll body 27R when carrier tape processing device 3 disassembles reel 44 of roll body 43 with a reel and roll body 27R is separated from reel 44. When roll body 41 in a case is stored in storage warehouse 4, storage position information generation unit 94d specifies storage position 82S of roll body 41 in a case and generates the storage position information.

As illustrated in FIG. 15, carrier tape processing device 3 includes processing device controller 3C. Processing device controller 3C controls reel conveyance unit 62, roll body taking-out unit 63, reading unit 65, writing unit 66, and the like included in carrier tape processing device 3. As illustrated in FIG. 15, storage warehouse 4 includes warehouse controller 4C. Warehouse controller 4C controls moving table 84, case transfer mechanism 85, and non-contact reader 90 included in storage warehouse 4.

Figure 16:
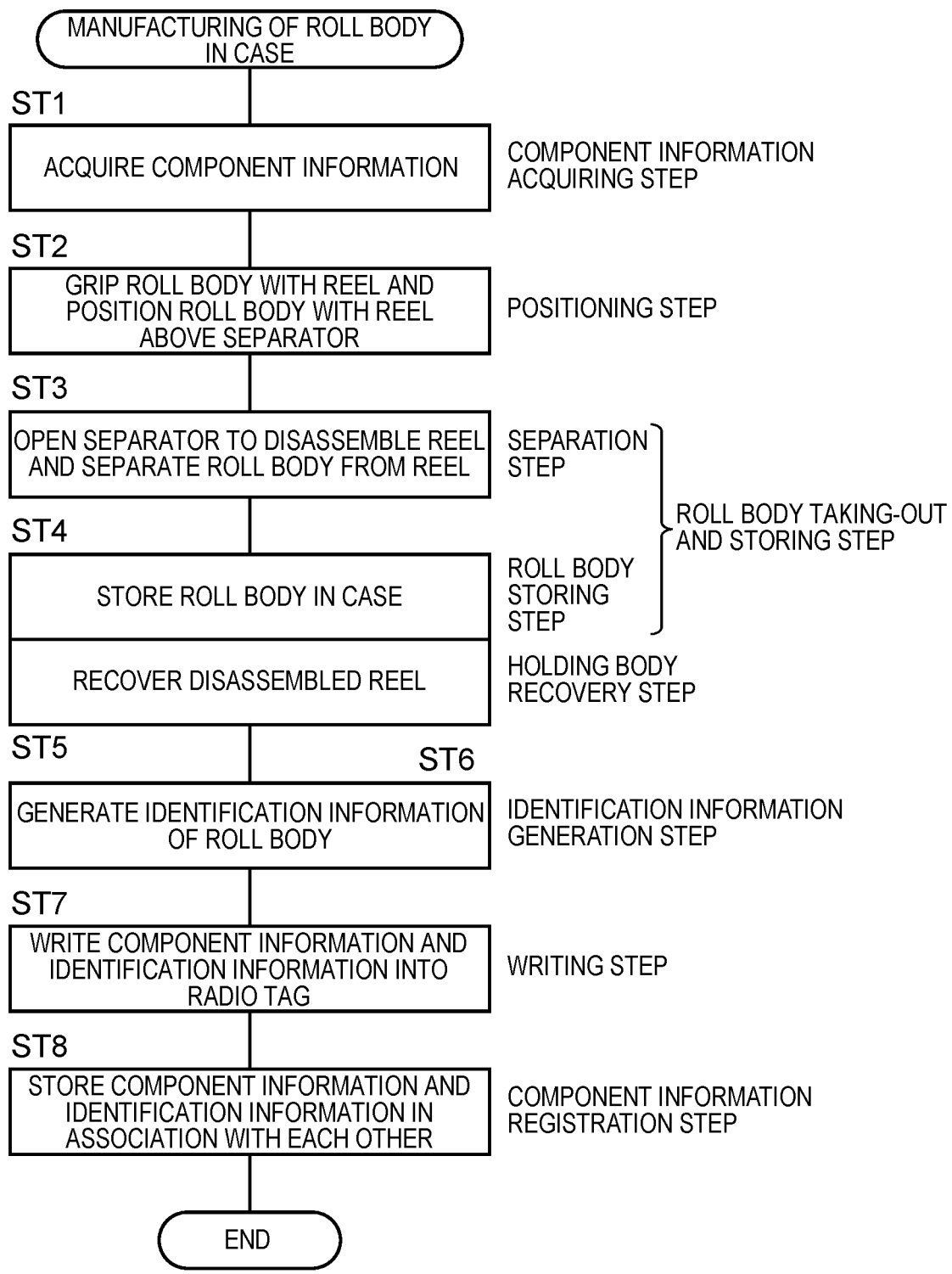
FIG. 16 is a flowchart illustrating a flow of work of manufacturing the roll body in a case by the carrier tape processing device according to the exemplary embodiment of the present disclosure.

Next, with reference to a flowchart illustrated in FIG. 16, a flow of a manufacturing operation (a processing operation of carrier tape 27) of roll body 41 in a case by carrier tape processing device 3 will be described. First, processing device controller 3C of carrier tape processing device 3 acquires component information of roll body 43 with a reel to be worked out of roll body 43 with a reel supplied by reel supply unit 61 (component information acquiring step in step ST1). Here, the acquisition of the component information is performed by reading unit 65 reading the identifier of code label 43L attached to reel 44 of roll body 43 with a reel to be worked (FIG. 9), but another method may be used. For example, operator OP may perform an input corresponding to the content of code label 43L from an input device (not illustrated) connected to processing device controller 3C.

When the component information of roll body 43 with a reel is acquired in step ST1, processing device controller 3C operates reel conveyance unit 62 of carrier tape processing device 3 to cause gripping head 71 to grip roll body 43 with a reel to be worked. Then, when gripping head 71 grips roll body 43 with a reel, gripping head 71 is moved (FIG. 10) to position roll body 43 with a reel above separator 73 (positioning step in step ST2. FIG. 11).

After positioning roll body 43 with a reel above separator 73, processing device controller 3C disassembles reel 44 by separator 73 as described above (FIG. 12A→FIG. 12B→FIG. 12C), and separates roll body 27R from reel 44 (separation step in step ST3). As a result, reel 44 is divided into two parts, that is, a part including one of side plates 45 and a part including the other of side plates 45, and roll body 27R passes through roll body storage unit 63B and is stored in empty case 42 located immediately below roll body storage unit 63B (roll body storing step in step ST4). Each of two divided reels 44 passes through reel discharge chute 75 and is recovered in recovery box 76 (holding body recovery step in step ST5).

Here, the separation step in step ST3 and the roll body storing step in step ST4 are a roll body taking-out and storing step in which roll body 27R is taken out from reel 44 and stored in case 42. Here, reel 44 is a holding body that holds carrier tape 27 storing component BH in a state of roll body 27R. In the roll body taking-out and storing step, in the roll body storing step, roll bodies 27R separated from reel 44 in the separation step are stored one by one in empty case 42. Therefore, one roll body 27R can be managed in units of one case 42.

When separating reel 44 in step ST3, processing device controller 3C requests identification information generation unit 94c of management computer 6 to generate the identification information on roll body 27R separated from reel 44. Then, identification information generation unit 94c requested by processing device controller 3C to generate the identification information generates the identification information on roll body 27R taken out by separation of reel 44 (identification information generation process of step ST6).

When the identification information is generated by identification information generation unit 94c in step ST6, processing device controller 3C of carrier tape processing device 3 receives the generated identification information. Then, writing unit 66 writes the component information acquired in step ST1 and the identification information generated in step ST6 in radio tag 42M attached to case 42 (case 42 in which roll body 27R is stored in step ST4) (writing step in step ST7).

After writing the component information and the identification information in radio tag 42M of case 42, processing device controller 3C transmits the information written in radio tag 42M (the component information and the identification information on roll body 27R) to management computer 6, and causes first information management unit 94a of management computer 6 to store the information (the component information and the identification information). As a result, for roll body 27R separated from reel 44, the identification information, which is the information unique to roll body 27R, and the component information, which is the information on component BH stored in roll body 27R, are registered in management computer 6 in association with each other (component information registration step in step ST8).

After writing the information on roll body 27R in first information management unit 94a of management computer 6, processing device controller 3C ends the manufacture of roll body 41 in a case by carrier tape processing device 3 (processing operation of carrier tape 27).

Figure 17:
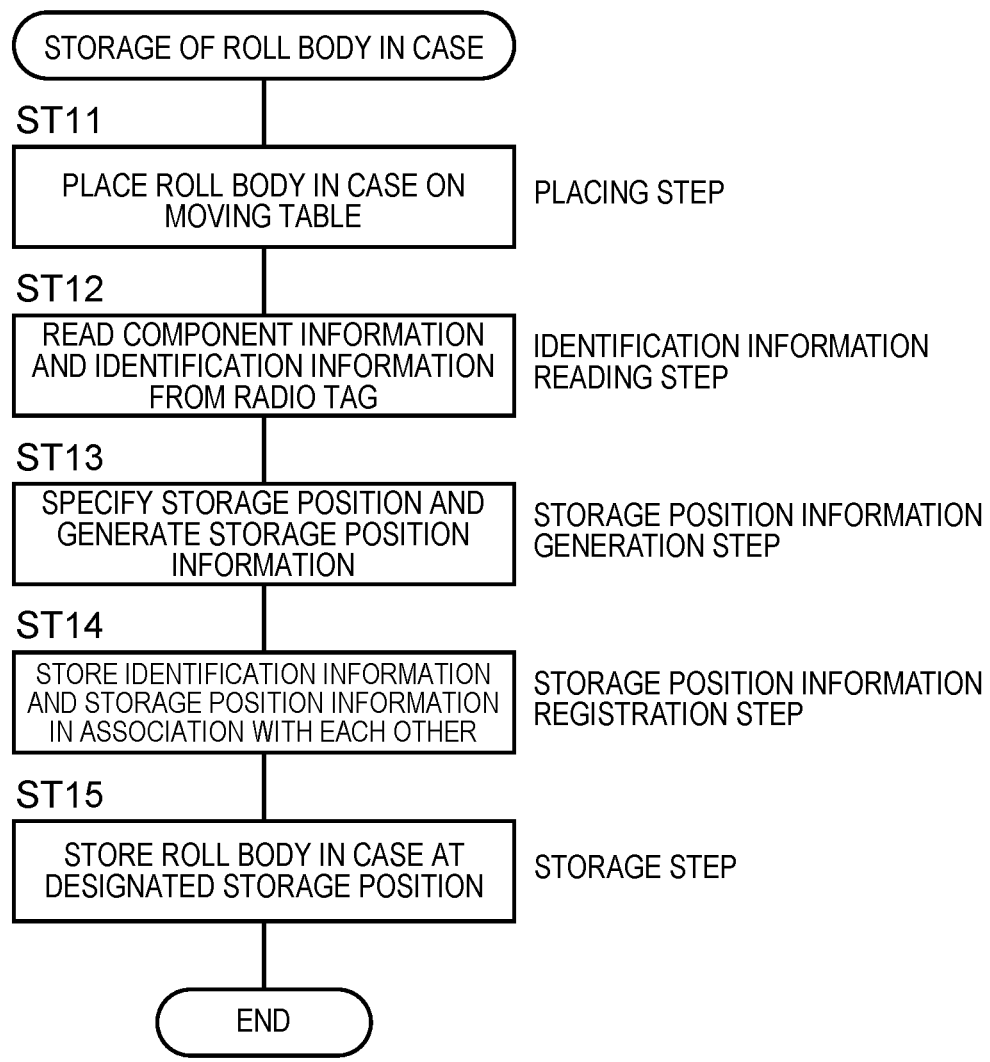
FIG. 17 is a flowchart illustrating a flow of work of storing the roll body in a case in the storage warehouse according to the exemplary embodiment of the present disclosure.

Next, a flow of an operation of storing roll body 41 in a case will be described with reference to a flowchart illustrated in FIG. 17. First, warehouse controller 4C of storage warehouse 4 moves moving table 84 to a front side from inlet 83 provided in housing 81. Then, operator OP (or a mobile robot (not illustrated)) places roll body 41 in a case on moving table 84 (placing step in step ST11. FIG. 14). At this time, roll body 41 in a case is placed on moving table 84 in an attitude in which upper opening 55 faces upward and front wall 53 faces the front side (the side of operator OP). As a result, radio tag 42M provided in case 42 faces the front side (FIG. 14).

When roll body 41 in a case is placed on moving table 84, warehouse controller 4C moves moving table 84 to draw roll body 41 in a case into housing 81. When roll body 41 in a case is drawn into housing 81, warehouse controller 4C moves transfer head 89 to the front side of roll body 41 in a case placed on moving table 84. Then, two fingers 89F are operated to close to cause transfer head 89 to grip roll body 41 in a case. At this time, non-contact reader 90 provided in transfer head 89 faces radio tag 42M provided in case 42 of roll body 41 in a case, and non-contact reader 90 reads the identification information written in radio tag 42M (identification information reading step in step ST12).

When non-contact reader 90 reads the identification information written in radio tag 42M, warehouse controller 4C transmits the identification information read by non-contact reader 90 to management computer 6. Then, management computer 6 having received the transmission of the identification information from warehouse controller 4C specifies storage position 82S in storage warehouse 4 of roll body 41 in a case corresponding to the identification information (roll body 41 in a case from which non-contact reader 90 has read the identification information) in storage position information generation unit 94d, and generates the storage position information (storage position information generation step in step ST13). Storage position 82S is specified by being arbitrarily selected from storage positions 82S that are in an empty state at that time or according to a predetermined rule.

When storage position information generation unit 94d generates the storage position information in step ST13, management computer 6 causes second information management unit 94b to store the generated storage position information and the identification information of roll body 41 in a case corresponding to the storage position information in association with each other. As a result, for roll body 41 in a case to be stored in storage warehouse 4, the identification information, which is unique information of roll body 27R, and the information of the storage position (storage position information) of roll body 41 in a case including roll body 27R in storage warehouse 4 are registered in management computer 6 in association with each other (storage position information registration step in step ST14).

When management computer 6 causes second information management unit 94b to store the storage information and the identification information on roll body 41 in a case placed on moving table 84 in association with each other, management computer 6 operates case transfer mechanism 85 to transfer roll body 41 in a case placed on moving table 84 to storage position 82S corresponding to the storage position information to store (storage step in step ST15). Accordingly, the storage operation of roll body 41 in a case is completed.

As described above, in the present exemplary embodiment, roll body 27R can be taken out from a holding body such as reel 44 and stored in case 42, and roll body 27R can be handled as roll body 41 in a case. Roll body 41 in a case can be made compact by making the size in the width direction smaller than that of roll body 43 with a reel, and reel 44 does not remain as a waste after roll body 27R is used up (that is, carrier tape 27), so that workability is good. Further, case 42 itself is inexpensive, and can be reused (reused) differently from reel 44, so that the cost can be reduced also in this respect.

Furthermore, in the present exemplary embodiment, radio tag 42M as a storage unit capable of storing component information is provided in case 42, and the component information recorded on reel 44 can be written and stored in radio tag 42M. Therefore, even when roll body 27R is taken out from reel 44, the component information is not lost, and the component information can be managed in each unit of roll body 41 in a case. In addition, since the component information and the identification information, which is information unique to roll body 27R, are stored in association with each other, the component information can be managed in each unit of roll body 41 in a case.

In component mounting system 1 described above, carrier tape processing device 3 (processing device controller 3C, reel conveyance unit 62, roll body taking-out unit 63, reading unit 65 as component information acquisition unit, and writing unit 66), storage warehouse 4 (warehousing controller 4C, shelf parts 82, case transfer mechanism 85, and non-contact reader 90 as identification information reading unit), and information management unit 94 (first information management unit 94a, second information management unit 94b, identification information generation unit 94c, and storage position information generation unit 94d) constitute component management device 100 (FIG. 15).

In the management work (component management method) of component BH using component management device 100, first, the component information is acquired (component information acquisition step), the identification information is generated (identification information generation step), the component information and the identification information are written in radio tag 42M provided in case 42 (writing step), and the written component information and the identification information are associated with each other and stored in first information management unit 94a (component information registration step). The identification information reading unit (non-contact reader 90) reads the identification information written in radio tag 42M (identification information reading step), the storage position information generation unit generates the storage position information by specifying storage position 82S (storage position information generation step), and second information management unit 94b stores the identification information and the storage position information in association with each other (storage position information registration step).

According to such a component management method, since the component information and the identification information of roll body 41 in a case are stored in association with each other, and the identification information and the storage position information of roll body 41 in a case are stored in association with each other, it is possible to smoothly store and take out roll body 41 in a case in storage warehouse 4. Therefore, according to component management device 100 (component management method) in the present exemplary embodiment, it is possible to easily and efficiently store and unload components BH.

Note that roll body 27R of roll body 41 in a case handled by component management device 100 in the present exemplary embodiment is not necessarily taken out from roll body 43 with a reel, and may be manufactured as roll body 27R of carrier tape 27 from the beginning. For example, roll body 27R may be manufactured by winding a large capacity carrier tape from a roll body while measuring a length of the carrier tape, which is a basis for manufacturing the roll body 43 with a reel.

Figure 18:
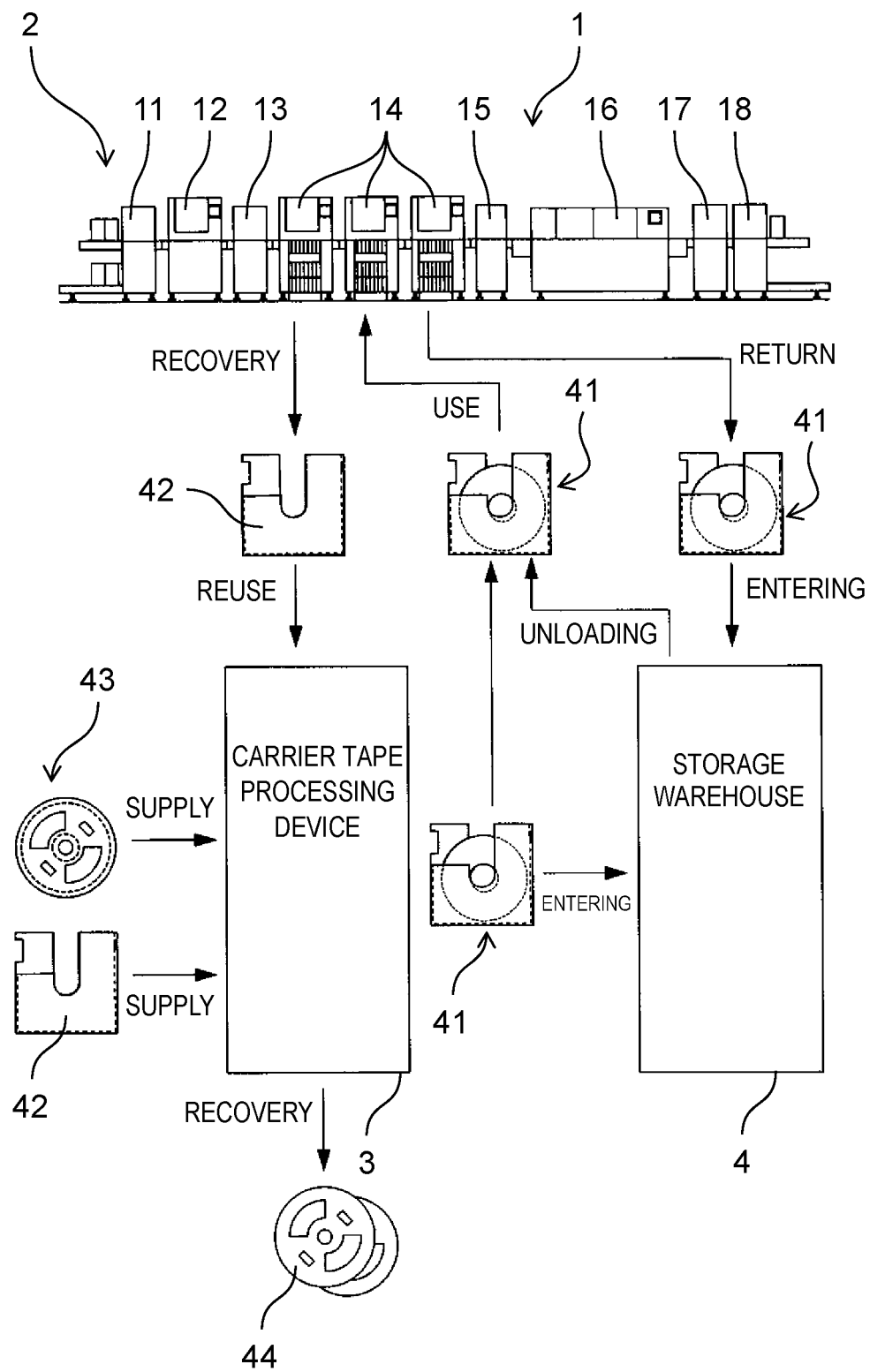
FIG. 18 is a diagram illustrating an image of an operation of the roll body in a case according to the exemplary embodiment of the present disclosure.

FIG. 18 illustrates an image of an operation of roll body 41 in a case in component mounting system 1 in the present exemplary embodiment. As illustrated in this drawing, roll body 41 in a case in the present exemplary embodiment is manufactured by supplying roll body 43 with a reel and case 42 to carrier tape processing device 3. A part of roll body 41 in a case manufactured by carrier tape processing device 3 is sent to manufacturing line 2 to be used, and the other part is stored (stored) in storage warehouse 4. Roll body 41 in a case stored in storage warehouse 4 is delivered therefrom and sent to manufacturing line 2 to be used. Case 42 caused by carrier tape 27 of roll body 41 in a case being used up in manufacturing line 2 is recovered and supplied to carrier tape processing device 3 to be reused for manufacturing of new roll body 41 in a case. A part of roll body 41 in a case sent to manufacturing line 2 in a state where carrier tape 27 has not been used up is returned to storage warehouse 4 and stored (received).

As described above, in carrier tape processing device 3 (carrier tape processing method) according to the present exemplary embodiment, roll body 27R can be taken out from the holding body such as reel 44 and stored in case 42, and roll body 27R can be handled as roll body 41 in a case. Roll body 41 in a case can be made compact by making the size in the width direction smaller than that of roll body 43 with a reel, and reel 44 does not remain as a waste after roll body 27R is used up (that is, carrier tape 27), so that workability is good.

Further, case 42 itself is inexpensive, and can be reused (reused) differently from reel 44, so that the cost can be reduced also in this respect. Therefore, according to carrier tape processing device 3 (carrier tape processing method) of the present exemplary embodiment, a component supply form without a reel can be realized with an inexpensive configuration.

Furthermore, in the present exemplary embodiment, radio tag 42M as a storage unit capable of storing component information is provided in case 42, and the component information recorded on reel 44 can be written and stored in radio tag 42M. Therefore, even when roll body 27R is taken out from reel 44, the component information is not lost, and the component information can be managed in units of each roll body 41 in a case. In addition, since the component information and the identification information, which is information unique to roll body 27R, are stored in association with each other, the component information can be managed in each unit of roll body 41 in a case. Therefore, according to carrier tape processing device 3 (carrier tape processing method) of the present exemplary embodiment, it is possible to realize a component supply form without a reel with an inexpensive configuration while managing component information.

While the exemplary embodiment of the present disclosure has been described above, the present disclosure is not limited to the above exemplary embodiment, and various modifications and the like can be made. For example, in the above-described exemplary embodiment, reel 44 of roll body 43 with a reel is divided into two. However, this is an example, and the reel may be divided into three or more parts. Even in this case, it is sufficient that each of the plurality of parts generated by the disassembly passes through reel discharge chute 75 and falls into recovery box 76, whereby disassembled reel 44 can be reliably recovered.

Further, the configuration of the disassembly unit of reel 44 and the disassembly method described in the above-described exemplary embodiment are merely examples, and roll body 27R may be taken out from reel 44 by disassembling with another method. Furthermore, as long as reel 44 can be removed without disassembling reel 44 (for example, a configuration in which one side plate 45 of reel 44 is provided, winding core 46 extends from one side plate 45 in a cantilevered state, and roll body 27R can be separated from reel 44 when roll body 27R is removed from winding core 46), it is not always necessary to disassemble reel 44. Furthermore, the specific configuration of roll body taking-out unit 63 described in the above-described exemplary embodiment is merely an example, and the configuration is arbitrarily as long as roll body 27R can be taken out from the holding body such as reel 44 that holds carrier tape 27 storing component BH in the state of roll body 27R and stored in case 42.

INDUSTRIAL APPLICABILITY

To provide a carrier tape processing device and a carrier tape processing method capable of realizing a component supply form without a reel with an inexpensive configuration.

REFERENCE MARKS IN THE DRAWINGS

3: carrier tape processing device
27: carrier tape
27R: roll body
41: roll body in a case
42: case
42M: radio tag (storage unit)
43: roll body with a reel
44: reel (holding body)
45: side plate
46: winding core
63: roll body taking-out unit
63A: separation unit
63B: roll body storage unit
63Ba: case holding part
63Bb: chute part
64: recovery unit
65: reading unit (component information acquisition unit)
66: writing unit
82: shelf part (storage part)
94: information management unit
94a: first information management unit
94b: second information management unit
94c: identification information generation unit
94d: storage position information generation unit
BH: component

The invention claimed is:

1. A carrier tape processing device comprising
a roll body taking-out unit that takes out a roll body from a holding body and stores the roll body in a case, the holding body being a reel and holding a carrier tape storing components in a state of the roll body, wherein
the roll body taking-out unit includes:
a separation unit that separates the roll body from the holding body; and
a roll body storage unit that stores, into the case, the roll body separated from the holding body by the separation unit.

2. The carrier tape processing device according to claim 1, wherein
the roll body storage unit includes:
a case holding part that holds the case; and
a chute part that stores the roll body separated from the holding body by the separation unit one by one in the case held by the case holding part.

3. The carrier tape processing device according to claim 1, wherein the separation unit separates the roll body from the holding body by disassembling the holding body.

4. The carrier tape processing device according to claim 1, further comprising a recovery unit that recovers the holding body from which the roll body has been separated by the separation unit.

5. The carrier tape processing device according to claim 1, wherein
the reel includes a winding core around which the carrier tape is wound and a pair of side plates sandwiching the winding core, and
the separation unit disassembles the holding body by dividing the holding body into two parts, a part including one of the side plates and a part including another of the side plates.

6. A carrier tape processing method comprising
a roll body taking-out and storing step of taking out a roll body from a holding body that is a reel and holds a carrier tape storing components in a state of the roll body, and storing the roll body in a case, wherein the roll body taking-out and storing step includes:
a separation step of separating the roll body from the holding body; and
a roll body storing step of storing the roll body separated from the holding body in the separation step in the case.

7. The carrier tape processing method according to claim 6, wherein in the roll body storing step, the roll body separated from the holding body in the separation step is stored one by one in the case.

8. The carrier tape processing method according to claim 6, wherein in the separation step, the roll body is separated from the holding body by disassembling the holding body.

9. The carrier tape processing method according to claim 6, wherein
the reel includes a winding core around which the carrier tape is wound and a pair of side plates sandwiching the winding core, and
in the separation step, the holding body is divided into two parts, a part including one of the side plates and a part including another of the side plates, and disassembled.

10. The carrier tape processing method according to claim 6, further comprising a holding body recovering step of recovering the holding body from which the roll body has been separated in the separation step.

11. A carrier tape processing device comprising:
a roll body taking-out unit that takes out a roll body from a holding body that is a reel and holds a carrier tape storing components in a state of the roll body, and stores the roll body in a case including a storage unit;
a component information acquisition unit that acquires component information that is information on the components; and
a writing unit that writes the component information acquired by the component information acquisition unit in the storage unit, wherein
the roll body taking-out unit includes:
a separation unit that separates the roll body from the holding body; and
a roll body storage unit that stores, into the case, the roll body separated from the holding body by the separation unit.

12. The carrier tape processing device according to claim 11, wherein the component information is recorded in the holding body, and the component information acquisition unit acquires the component information by reading the component information recorded in the holding body.

13. The carrier tape processing device according to claim 12, wherein the component information acquisition unit reads the component information before the roll body is separated from the holding body.

14. The carrier tape processing device according to claim 11, further comprising an identification information generation unit that generates identification information used to identify the components from a component stored in another case,
wherein the writing unit writes the identification information together with the component information.

15. The carrier tape processing device according to claim 14, further comprising an information management unit that stores the component information read by the component information acquisition unit and the identification information generated by the identification information generation unit in association with each other.

16. The carrier tape processing device according to claim 11, wherein the component information includes at least one of a component type, a component name, a characteristic, a date of manufacture, a manufacturer, an expiration date, a number of components, and access information for accessing these pieces of information.

17. A carrier tape processing method comprising:
a roll body taking-out and storing step of taking out a roll body from a holding body that is a reel and holds a carrier tape storing components in a state of the roll body, and storing the roll body in a case including a storage unit; and
a writing step of writing component information that is information on the components, in the storage unit, wherein
the roll body taking-out and storing step includes:
a separation step of separating the roll body from the holding body; and
a roll body storing step of storing the roll body separated from the holding body in the separation step in the case.

18. The carrier tape processing method according to claim 17, further comprising a component information acquisition step of acquiring the component information recorded in the holding body,
wherein, in the writing step, the component information acquired in the component information acquisition step is written in the storage unit.

19. The carrier tape processing method according to claim 18, wherein in the component information acquisition step, the component information is read and acquired before the roll body is separated from the holding body.

20. The carrier tape processing method according to claim 18,
further comprising an identification information generation step of generating identification information used to identify the components from a component stored in another case,
wherein in the writing step, the identification information is written together with the component information.

21. The carrier tape processing method according to claim 20, further comprising a component information registration step of storing the component information acquired in the component information acquisition step and the identification information generated in the identification information generation step in association with each other.

22. The carrier tape processing method according to claim 17, wherein the component information includes at least one of a component type, a component name, characteristics, a date of manufacture, a manufacturer, an expiration date, a number of components, and access information for accessing these pieces of information.

* * * * *